(12) United States Patent
Furue et al.

(10) Patent No.: US 11,605,788 B2
(45) Date of Patent: Mar. 14, 2023

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Ryuhei Furue, Yokohama (JP); Yuuki Miyazaki, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 245 days.

(21) Appl. No.: 16/893,984

(22) Filed: Jun. 5, 2020

(65) Prior Publication Data
US 2020/0411764 A1 Dec. 31, 2020

(30) Foreign Application Priority Data
Jun. 28, 2019 (KR) .................. 10-2019-0078042

(51) Int. Cl.
*H01L 51/00* (2006.01)
*H01L 51/50* (2006.01)

(52) U.S. Cl.
CPC ........ *H01L 51/008* (2013.01); *H01L 51/5016* (2013.01)

(58) Field of Classification Search
CPC ............... H01L 51/008; H01L 51/5016; H01L 51/5012; H01L 51/0061; H01L 51/0067; H01L 51/0071; H01L 51/0072; H01L 51/0073; H01L 51/0074; H01L 51/009; H01L 51/0068; H01L 51/5024;
(Continued)

(56) References Cited

U.S. PATENT DOCUMENTS

| 8,932,731 B2 | 1/2015 | Parham et al. |
| 2019/0256538 A1 | 8/2019 | Hatakeyama et al. |

(Continued)

FOREIGN PATENT DOCUMENTS

| CN | 107266484 A | 10/2017 |
| CN | 107501311 A | 12/2017 |

(Continued)

*Primary Examiner* — Ermias T Woldegeorgis
(74) *Attorney, Agent, or Firm* — Lewis Roca Rothgerber Christie LLP

(57) ABSTRACT

An organic electroluminescence device of an embodiment includes a first electrode, a second electrode, and an emission layer between the first electrode and the second electrode, wherein the emission layer includes a polycyclic compound represented by Formula 1 and shows high emission efficiency and excellent color reproducibility.

[Formula 1]

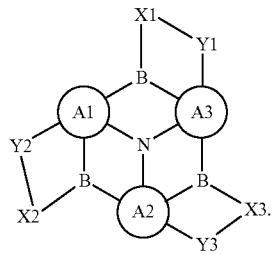

20 Claims, 2 Drawing Sheets

(58) Field of Classification Search
CPC . C07F 5/027; C09K 11/06; C09K 2211/1007; C09K 2211/1014; C09K 2211/1029; C09K 2211/104; C09K 2211/1044; C09K 2211/1055; C09K 2211/1059; C09K 2211/107; C09K 2211/1085; C09K 2211/1088; C09K 2211/1092
See application file for complete search history.

(56) References Cited

U.S. PATENT DOCUMENTS

2020/0203651 A1\* 6/2020 Duan .................. H01L 51/5004
2020/0203652 A1 6/2020 Duan et al.

FOREIGN PATENT DOCUMENTS

| CN | 109192874 A | \* | 1/2019 | ......... H01L 51/0072 |
|----|-------------|---|--------|-----------------------|
| CN | 109192874 A |   | 1/2019 |                       |
| CN | 109411634 A |   | 3/2019 |                       |
| DE | 10 2005 043 163 A1 | | 3/2007 |                  |
| JP | 5813707 B2  |   | 11/2015 |                      |
| KR | 10-1506919 B1 | | 3/2015 |                        |
| WO | WO 2010/050778 A1 | | 5/2010 |                    |
| WO | WO 2015/102118 A1 | | 7/2015 |                    |
| WO | WO 2018/047639 A1 | | 3/2018 |                    |

\* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0078042, filed on Jun. 28, 2019, the entire content of which is hereby incorporated by reference.

BACKGROUND

1. Field

One or more aspects of embodiments of the present disclosure are related to an organic electroluminescence device and a polycyclic compound used therein, and for example, to a polycyclic compound used as a light-emitting material and an organic electroluminescence device including the same.

2. Description of the Related Art

Organic electroluminescence display devices are actively being developed as image display devices. An organic electroluminescence display device differs from a liquid crystal display device in that it acts as a so-called self-luminescent display device, in which holes and electrons injected from a first electrode and a second electrode recombine in an emission layer, and a light-emitting material including an organic compound in the emission layer emits light to attain display.

For an organic electroluminescence device to be applied to a display device, a decrease in driving voltage, and increases in emission efficiency and lifetime of the organic electroluminescence device are desired, and improved materials capable of stably attaining such requirements for an organic electroluminescence device are also desired.

In order to accomplish an organic electroluminescence device with high efficiency, phosphorescence emission techniques that use energy in a triplet state or delayed fluorescence emission techniques that use the generation of singlet excitons by the collision of triplet excitons (triplet-triplet annihilation, TTA) are being developed, and development of materials for thermally activated delayed fluorescence (TADF) is being conducted.

SUMMARY

One or more aspects of embodiments of the present disclosure are directed toward an organic electroluminescence device having excellent life characteristics and/or good emission efficiency.

One or more aspects of embodiments of the present disclosure are directed toward a polycyclic compound that is a material for an organic electroluminescence device having high efficiency and/or long life characteristics.

One or more example embodiments of the present disclosure provide a polycyclic compound represented by Formula 1:

[Formula 1]

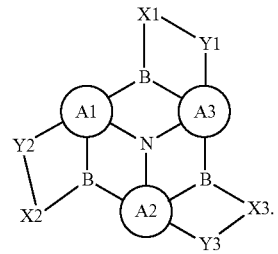

In Formula 1, A1, A2, and A3 are each independently a substituted or unsubstituted hydrocarbon ring of 5 to 30 carbon atoms to form a ring, or a substituted or unsubstituted heterocycle of 2 to 30 carbon atoms to form a ring; X1, X2, and X3 are each independently a substituted or unsubstituted hydrocarbon ring of 5 to 30 carbon atoms to form a ring, or a substituted or unsubstituted heterocycle of 2 to 30 carbon atoms to form a ring; and Y1, Y2, and Y3 are each independently *—NRa—*, *—O—*, or *—S—*. Ra is a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, or a substituted or unsubstituted heteroaryl group of 2 to 30 carbon atoms to form a ring.

In an embodiment, A1, A2, and A3 may each independently be an unsubstituted benzene ring, or a benzene ring substituted with at least one substituent, and the at least one substituent may be a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group.

In an embodiment, X1, X2, and X3 may each independently be an unsubstituted benzene ring, or a benzene ring substituted with at least one substituent, and the at least one substituent may be a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group.

In an embodiment, Formula 1 may be represented by Formula 2:

[Formula 2]

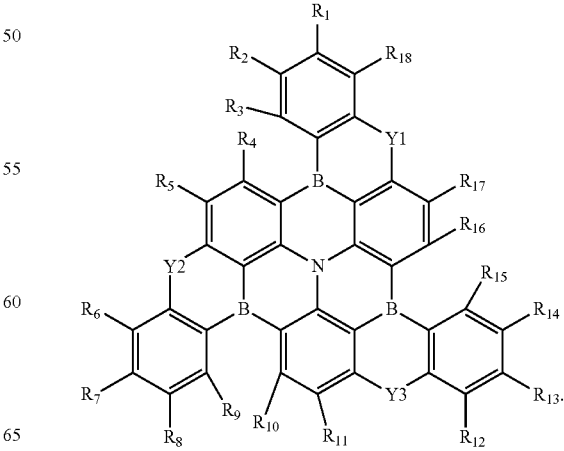

In Formula 2, $R_1$ to $R_{18}$ are each independently a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group, and Y1, Y2, and Y3 are each the same as defined in Formula 1.

In an embodiment, Y1, Y2, and Y3 may be the same (e.g., the same atomic element).

In an embodiment, at least one selected from Y1, Y2, and Y3 may be *—NRa—*, and the remainder (e.g., remaining atoms) may be *—O—*, or *—S—*.

In an embodiment, the polycyclic compound represented by Formula 1 may be a blue dopant to emit blue light having a central wavelength of about 470 nm or less.

In an embodiment, the lowest triplet excitation energy level ($T_1$ level) of the polycyclic compound represented by Formula 1 may be greater than about 2.6 eV.

In an embodiment, the polycyclic compound represented by Formula 1 may be a material to emit thermally activated delayed fluorescence.

One or more example embodiments of the present disclosure provide an organic electroluminescence device including a first electrode; a second electrode disposed on the first electrode; and an emission layer disposed between the first electrode and the second electrode and including the polycyclic compound. The first electrode and the second electrode may each independently include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), indium (In), tin (Sn), zinc (Zn), any compound thereof, any mixture thereof, or any oxide compound thereof.

In an embodiment, the emission layer may be to emit delayed fluorescence.

In an embodiment, the emission layer may include a host and a dopant, and the dopant may include the polycyclic compound.

In an embodiment, the emission layer may be to emit light with a central wavelength of about 430 nm to about 470 nm.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
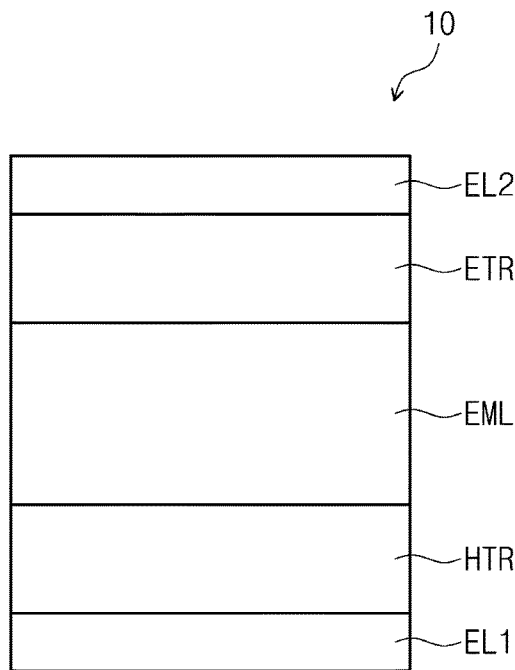
FIG. 1 is a cross-sectional view schematically illustrating an organic electroluminescence device according to an embodiment of the present disclosure.

The present disclosure may have various modifications and may be embodied in different forms, and example embodiments will be explained in more detail with reference to the accompanying drawings. The present disclosure may, however, be embodied in different forms and should not be construed as being limited to the embodiments set forth herein. Rather, all modifications, equivalents, and substituents which are included in the spirit and technical scope of the present disclosure should be included in the present disclosure.

It will be understood that when an element (or region, layer, part, etc.) is referred to as being "on", "connected to" or "coupled to" another element, it can be directly on, connected or coupled to the other element or a third intervening elements may be present. When an element is referred to as being "directly on," "directly connected to," or "directly coupled to" another element, there are no intervening elements present.

Like reference numerals refer to like elements throughout, and duplicative descriptions thereof may not be provided. In the drawings, the thickness, the ratio, and the dimensions of constituent elements are exaggerated for effective explanation of technical contents.

The term "and/or" includes one or more combinations which may be defined by relevant elements.

It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In addition, the terms "below", "beneath", "on" and "above" are used for explaining the relation of elements shown in the drawings. The terms are relative concept and are explained on the basis of the direction shown in the drawing.

Unless otherwise defined, all terms (including technical and scientific terms) used herein have the same meaning as commonly understood by one of ordinary skill in the related art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, expressions such as "at least one of," "one of," and "selected from," when preceding a list of elements, modify the entire list of elements and do not modify the individual elements of the list.

It will be further understood that the terms "includes," "including," "comprises," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to an embodiment of the present disclosure will be explained with reference to the attached drawings.

FIGS. 1 to 4 are cross-sectional views schematically showing organic electroluminescence devices according to example embodiments of the present disclosure. Referring to FIGS. 1 to 4, in an organic electroluminescence device 10 according to an embodiment, a first electrode EL1 and a second electrode EL2 are oppositely disposed, and between the first electrode EL1 and the second electrode EL2, an emission layer EML may be disposed.

The organic electroluminescence device 10 of an embodiment further includes a plurality of functional groups (e.g., functional layers) between the first electrode EL1 and the second electrode EL2 in addition to the emission layer EML. The plurality of functional groups may include a hole transport region HTR and an electron transport region ETR. For example, the organic electroluminescence device 10 of an embodiment may include a first electrode EL1, a hole transport region HTR, an emission layer EML, an electron transport region ETR, and a second electrode, laminated one by one. For example, the organic electroluminescence device 10 of an embodiment may include a capping layer CPL disposed on the second electrode EL2.

The organic electroluminescence device 10 of an embodiment may include a polycyclic compound of an embodiment, which will be explained later, in the emission layer EML disposed between the first electrode EL1 and the second electrode EL2. However, embodiments of the present disclosure is not limited thereto, and the organic electroluminescence device 10 of an embodiment may include a polycyclic compound of an embodiment, which will be explained later, in the hole transport region HTR and/or the electron transport region ETR (which are among the plurality of functional groups disposed between the first electrode EL1 and the second electrode EL2) in addition to the emission layer EML.

Figure 2:
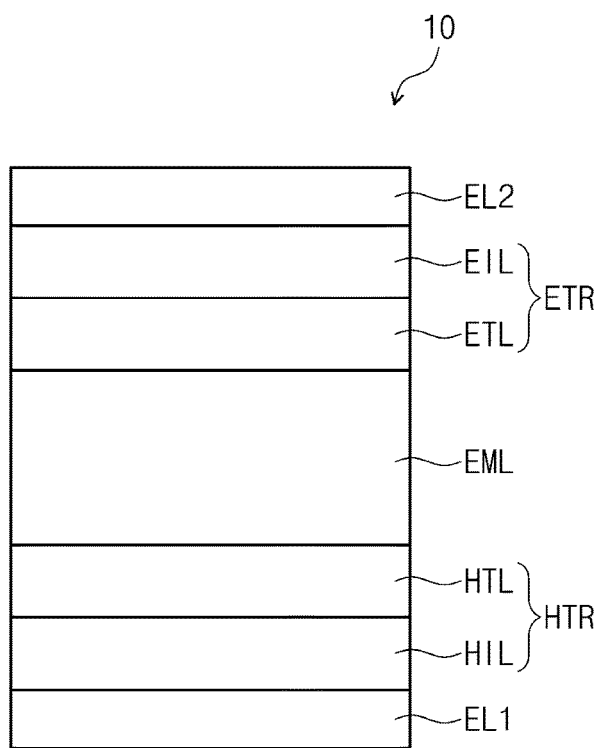
FIG. 2 is a cross-sectional view schematically illustrating an organic electroluminescence device according to an embodiment of the present disclosure.
Figure 3:
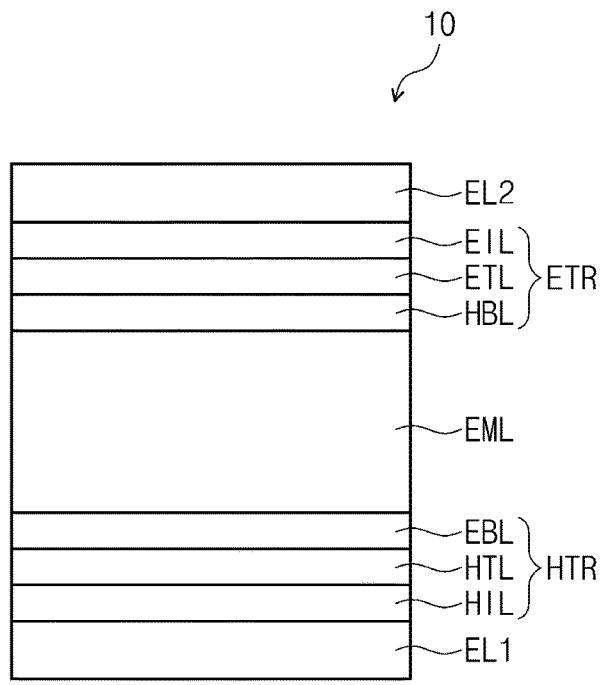
FIG. 3 is a cross-sectional view schematically illustrating an organic electroluminescence device according to an embodiment of the present disclosure.
Figure 4:
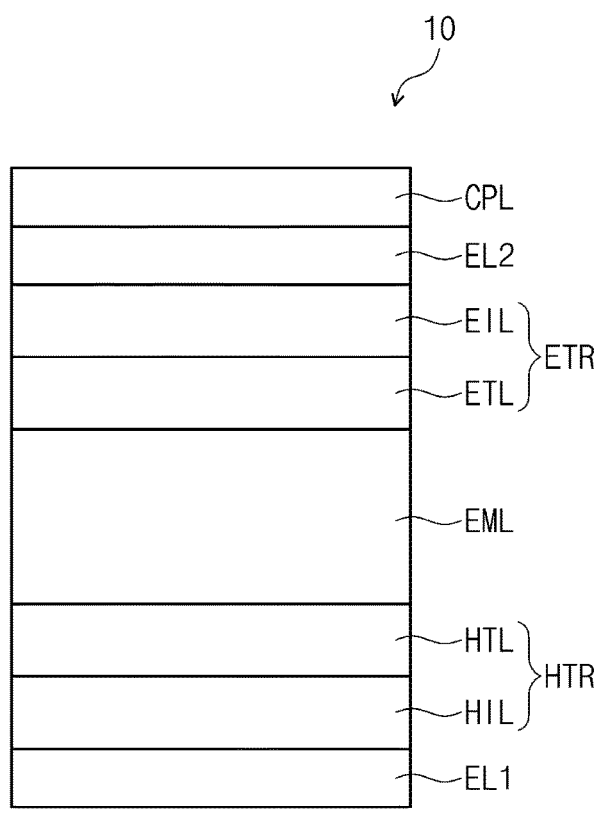
FIG. 4 is a cross-sectional view schematically illustrating an organic electroluminescence device according to an embodiment of the present disclosure.

When compared with FIG. 1, FIG. 2 shows the cross-sectional view of an organic electroluminescence device 10 of an embodiment, wherein the hole transport region HTR includes a hole injection layer HIL and a hole transport layer HTL, and the electron transport region ETR includes an electron injection layer EIL and an electron transport layer ETL. When compared with FIG. 1, FIG. 3 shows the cross-sectional view of an organic electroluminescence device 10 of an embodiment, wherein the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. When compared with FIG. 1, FIG. 4 shows the cross-sectional view of an organic electroluminescence device 10 of an embodiment including a capping layer CPL disposed on the second electrode EL2.

The first electrode EL1 has conductivity (e.g., may be conductive). The first electrode EU may be formed using a metal alloy and/or a conductive compound. The first electrode EL1 may be an anode. In some embodiments, the first electrode EL1 may be a pixel electrode. The first electrode EL1 may be a transmissive electrode, a transflective (semi-transmissive) electrode, or a reflective electrode. When the first electrode EL1 is a transmissive electrode, the first electrode EL1 may be formed using a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), any compound thereof, or any mixture thereof (for example, a mixture of Ag and Mg). In some embodiments, the first electrode EL1 may have a structure including a plurality of layers including a reflective layer or a transflective layer formed using the above materials, combined with a transmissive conductive layer formed using ITO, IZO, ZnO, or ITZO. For example, the first electrode EL1 may include a three-layer structure of ITO/Ag/ITO. However, embodiments of the present disclosure are not limited thereto. The thickness of the first electrode EL1 may be about 1,000 Å to about 10,000 Å, for example, about 1,000 Å to about 3,000 Å.

The hole transport region HTR is on the first electrode EL1. The hole transport region HTR may include at least one selected from a hole injection layer HIL, a hole transport layer HTL, a hole buffer layer, and an electron blocking layer EBL. The thickness of the hole transport region HTR may be about 50 Å to about 1,500 Å.

The hole transport region HTR may have or be a single layer formed using a single material, a single layer formed using a plurality of different materials, or a multilayer structure including a plurality of layers formed using a plurality of different materials.

In some embodiments, for example, the hole transport region HTR may have the structure of a single layer of a hole injection layer HIL using a hole injection material, or a hole transport layer HTL using a hole transport material. In some embodiments, the hole transport region HTR may have a structure of a single layer formed using a plurality of different materials, or a structure laminated from (on) the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine), N,N'-diphenyl-N,N'-bis-[4-(phenyl-m-tolyl-amino)-phenyl]-phenyl-4,4'-diamine (DNTPD), 4,4',4"-[tris(3-methylphenyl)phenylamino] triphenylamine (m-MTDATA), 4,4', 4"-tris(N,N-diphenylamino)triphenylamine (TDATA), 4,4', 4"-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PAN I/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2', 3'-h]quinoxaline-2,3,6,7,10,11-hexacarbonitrile (HAT-CN).

The hole transport layer HTL may include, for example, carbazole derivatives (such as N-phenyl carbazole and/or polyvinyl carbazole), fluorene-based derivatives, N,N'-bis (3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di (1-naphthalenyl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be about 50 Å to about 10,000 Å, for example, about 100 Å to about 5,000 Å. The thickness of the hole injection layer HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL and the electron blocking layer EBL each satisfy the above-described ranges, satisfactory hole transport properties may be achieved without a substantial increase in driving voltage.

The hole transport region HTR may further include a charge generating material in addition to the above-described materials to increase conductivity. The charge generating material may be dispersed substantially uniformly or non-uniformly in the hole transport region HTR. The charge generating material may be, for example, a p-dopant. The p-dopant may be a quinone derivative, a metal oxide, or a cyano group-containing compound, without limitation. Non-limiting examples of the p-dopant include quinone derivatives such as tetracyanoquinodimethane (TCNQ) and 2,3,5, 6-tetrafluoro-7,7',8,8'-tetracyanoquinodimethane (F4-TCNQ), and metal oxides such as tungsten oxide and molybdenum oxide, without limitation.

As described above, the hole transport region HTR may further include at least one selected from a hole buffer layer and an electron blocking layer EBL in addition to the hole injection layer HIL and the hole transport layer HTL. The hole buffer layer may compensate for an optical resonance distance according to the wavelength of light emitted from an emission layer EML, and may increase light emission efficiency. Materials that may be included in a hole transport region HTR may be included in a hole buffer layer. The electron blocking layer EBL may prevent or reduce electron injection from the electron transport region ETR to the hole transport region HTR.

The emission layer EML is on the hole transport region HTR. The emission layer EML may have a thickness of, for example, about 100 Å to about 1,000 Å or about 100 Å to about 300 Å. The emission layer EML may have or be a single layer formed using a single material, a single layer formed using a plurality of different materials, or a multi-layer structure having a plurality of layers formed using a plurality of different materials.

In the organic electroluminescence device 10 of an embodiment, the emission layer EML may include the polycyclic compound of an embodiment.

In the description, the term "substituted or unsubstituted" indicates a state or possibility of being unsubstituted, or substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. Each of the listed substituents may be further (e.g., may itself be) substituted or unsubstituted. For example, a biphenyl group may be interpreted as an aryl group, or as a phenyl group substituted with a phenyl group.

In the description, the term "to form a ring via combination with an adjacent group" indicates that the specified group, atom, or moiety may form a substituted or unsubstituted hydrocarbon ring, or a substituted or unsubstituted heterocycle, via combination (e.g., fusion) with an adjacent group. The term "hydrocarbon ring" includes an aliphatic hydrocarbon ring and an aromatic hydrocarbon ring. The term "heterocycle" includes an aliphatic heterocycle and an aromatic heterocycle. The ring formed by combination with an adjacent group may be a monocyclic ring or a polycyclic ring. In some embodiments, the ring formed via combination with an adjacent group may be combined with another ring to form a spiro structure.

In the description, the term "adjacent group" may indicate a substituent on an atom that is directly bonded or connected to the atom that is the base for the subject substituent, a substituent on the same atom as the subject substituent, or a substituent sterically positioned (e.g., in steric space) within bonding distance of the subject substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, the halogen atom may be a fluorine atom, a chlorine atom, a bromine atom or an iodine atom.

In the description, the alkyl group may be a linear, branched or cyclic group. The carbon number of the alkyl may be 1 to 50, 1 to 30, 1 to 20, 1 to 10, or 1 to 6. Non-limiting examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the hydrocarbon ring may be an aliphatic hydrocarbon ring or an aromatic hydrocarbon ring of 5 to 60, 5 to 30, or 5 to 20 carbon atoms to form a ring. The hydrocarbon ring may be an optional functional group or substituent derived from an aliphatic hydrocarbon ring, or an optional functional group or substituent derived from an aromatic hydrocarbon ring. The carbon number of the hydrocarbon ring to form a ring may be 5 to 60, 5 to 30, or 5 to 20.

In the description, the aryl group may be an optional functional group or substituent derived from an aromatic hydrocarbon ring. The aryl group may be a monocyclic aryl group or a polycyclic aryl group. The carbon number to form a ring in the aryl group may be 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc.

In the description, the heterocyclic group may be an optional functional group or substituent derived from a ring including one or more heteroatoms selected from B, O, N, P, Si, and S. The heterocyclic group may be an aliphatic heterocyclic group or an aromatic heterocyclic group. The aromatic heterocyclic group may be termed a heteroaryl group. The aliphatic heterocyclic group and the aromatic heterocyclic group may be a monocycle or polycycle.

In the description, the heterocycle may include one or more heteroatoms selected from B, O, N, P, Si and S. When the heterocycle includes two or more heteroatoms, the two or more heteroatoms may be the same or different. The heterocycle may be a monocyclic heterocycle or a polycyclic heterocycle, and in some embodiments may be a heteroaryl group. The carbon number to form the heterocycle may be 2 to 30, 2 to 20, or 2 to 10.

In the description, the aliphatic heterocyclic group may include one or more heteroatoms selected from B, O, N, P, Si and S. The carbon number to form a ring of the aliphatic heterocyclic group may be 2 to 30, 2 to 20, or 2 to 10. Non-limiting examples of the aliphatic heterocyclic group include an oxirane group, a thiirane group, a pyrrolidine group, a piperidine group, a tetrahydrofuran group, a tetrahydrothiophene group, a thiane group, a tetrahydropyrane group, a 1,4-dioxane group, etc.

In the description, the heteroaryl group may include one or more heteroatoms selected from B, O, N, P, Si, and S. When the heteroaryl group includes two or more heteroatoms, the two or more heteroatoms may be the same or different. The heteroaryl group may be a monocyclic heteroaryl group or a polycyclic heteroaryl group. The carbon number to form a ring of the heteroaryl group may be 2 to 30, 2 to 20, or 2 to 10. Non-limiting examples of the heteroaryl group include thiophenyl, furanyl, pyrrolyl, imidazolyl, thiazolyl, oxazolyl, oxadiazolyl, triazolyl, pyridinyl, bipyridinyl, pyrimidinyl, triazinyl, acridyl, pyridazinyl, pyrazinyl, quinolinyl, quinazolinyl, quinoxalinyl, phenoxazinyl, phthalazinyl, pyrido pyrimidinyl, pyrido pyrazinyl, pyrazino pyrazinyl, isoquinolinyl, indolyl, carbazolyl, N-arylcarbazolyl, N-heteroarylcarbazolyl, N-alkylcarbazolyl, benzoxazolyl, benzimidazolyl, benzothiazolyl, benzocarbazolyl, benzothiophenyl, dibenzothiophenyl, thienothiophenyl, benzofuranyl, phenanthrolinyl, isoxazolyl, thiadiazolyl, phenothiazinyl, dibenzosilolyl, dibenzofuranyl, etc.

In the description, the carbon number of the amine group is not specifically limited, and may be 1 to 30. The amine group may be an alkyl amine group or an aryl amine group. Non-limiting examples of the amine group include a methylamine group, a dimethylamine group, a phenylamine group, a diphenylamine group, a naphthylamine group, a 9-methyl-anthracenylamine group, a triphenylamine group, etc. For example, the alkyl group in the alkyl amine group is the same as the above-described alkyl group, and the aryl group in the aryl amine group is the same as the above-described aryl group.

In the description, the direct linkage may be a single bond.

In the description, "—*" indicates a position of connection to another formula, group, or moiety.

The emission layer EML of the organic electroluminescence device 10 of an embodiment may include a polycyclic compound of an embodiment represented by Formula 1:

[Formula 1]

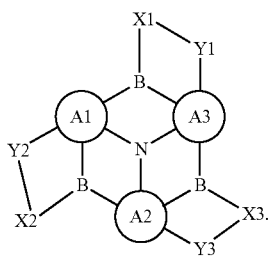

In Formula 1, A1, A2, and A3 are each independently a substituted or unsubstituted hydrocarbon ring of 5 to 30 carbon atoms to form a ring, or a substituted or unsubstituted heterocycle of 2 to 30 carbon atoms to form a ring. For example, A1, A2, and A3 may each independently be a substituted or unsubstituted aryl group of 5 to 30 carbon atoms to form a ring, or a substituted or unsubstituted heteroaryl group of 2 to 30 carbon atoms to form a ring.

When A1, A2, and A3 are each independently a substituted hydrocarbon ring or a substituted heterocycle, a substituent may be a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group. The amine group may be an alkyl amine group or an aryl amine group. For example, the amine group may be an alkyl amine group of 1 to 20 carbon atoms, or an aryl amine group of 6 to 30 carbon atoms to form a ring.

A1, A2, and A3 may each independently be a substituted or unsubstituted hydrocarbon ring of 5 to 30 carbon atoms to form a ring, or a substituted or unsubstituted heterocycle of 2 to 30 carbon atoms to form a ring.

In an embodiment, A1, A2, and A3 may each independently be an unsubstituted benzene ring, or a benzene ring substituted with at least one substituent. In case of the substituted benzene ring, the at least one substituent may be a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group.

In Formula 1, X1, X2 and X3 are each independently a substituted or unsubstituted hydrocarbon ring of 5 to 30 carbon atoms to form a ring, or a substituted or unsubstituted heterocycle of 2 to 30 carbon atoms to form a ring. For example, X1, X2, and X3 may each independently be a substituted or unsubstituted aryl group of 5 to 30 carbon atoms to form a ring, or a substituted or unsubstituted heteroaryl group of 2 to 30 carbon atoms to form a ring.

In an embodiment, X1, X2, and X3 may each independently be an unsubstituted benzene ring, or a benzene ring substituted with at least one substituent. For example, X1, X2, and X3 may each independently be an unsubstituted benzene ring, or a benzene ring substituted with at least one selected from a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, and a substituted or unsubstituted amine group.

In an embodiment, X1, X2, and X3 may all be the same, or at least one thereof may be different. For example, if at least one among X1, X2, and X3 is different, at least one substituent among the substituents substituted at the ring of X1, X2, and X3 may be different from each other.

In Formula 1, Y1, Y2, and Y3 are each independently *—NRa—*, *—O—*, or *—S—*. In some embodiments, Ra may be a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, or a substituted or unsubstituted heteroaryl group of 2 to 30 carbon atoms to form a ring.

For example, the polycyclic compound of an embodiment may be provided in a fixed state (e.g., may have a stable and/or rigid structure) through the combination of a ring such as A1, A2, and A3 with a ring such as X1, X2, and X3, via Y1, Y2, and Y3 represented by any one selected from *—NRa—*, *—O—*, and *—S—*. For example, the polycyclic compound of an embodiment may be provided in a fused ring state (structure) by connecting neighboring rings to each other via Y1, Y2, and Y3, which correspond to linkers including a heteroatom.

In an embodiment, Y1, Y2, and Y3 may all (e.g., simultaneously) be the same. In an embodiment, at least one selected from Y1, Y2, and Y3 may be *—NRa—*, and the remainder may be *—O—* or *—S—*.

The polycyclic compound of an embodiment, which is provided as a fixed type (structure) through connecting neighboring rings via Y1, Y2, and Y3, shows a high lowest triplet excitation energy level ($T_1$ energy level), and accordingly, reverse intersystem crossing may be easily generated. For example, the lowest triplet excitation energy level ($T_1$ energy level) of the polycyclic compound of an embodiment may be greater than about 2.6 eV.

The polycyclic compound of an embodiment provided as a connected type of polycyclic aromatic rings including boron (B) and nitrogen (N) as ring-forming atoms via *—NRa—*, *—O—*, or *—S—*, may be a light-emitting material configured to emit deep blue light having a central wavelength (λmax) of about 470 nm or less. For example, the polycyclic compound of an embodiment represented by Formula 1 may be a light-emitting material having a light-emitting central wavelength of about 430 nm to about 490 nm.

In an embodiment, Formula 1 may be represented by Formula 2:

In Formula 2, $R_1$ to $R_{18}$ may each independently be a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group.

In Formula 2, Y1, Y2, and Y3 are each independently *—NRa—*, *—O—*, or *—S—*, and Ra may be a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, or a substituted or unsubstituted heteroaryl group of 2 to 30 carbon atoms to form a ring.

In Formula 2, Y1, Y2, and Y3 may be the same as described in connection with Formula 1.

Formula 2 may be represented by any one selected from Formulae 2-1 to 2-7:

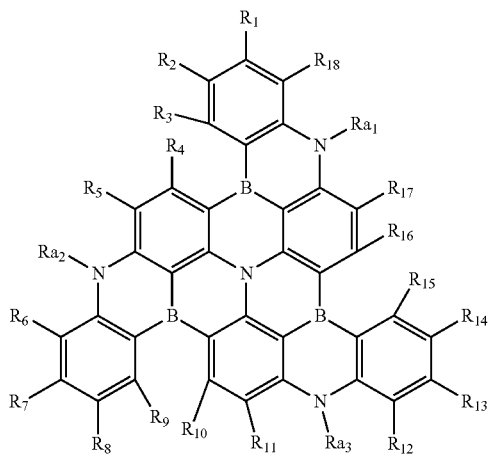

2-1

[Formula 2]

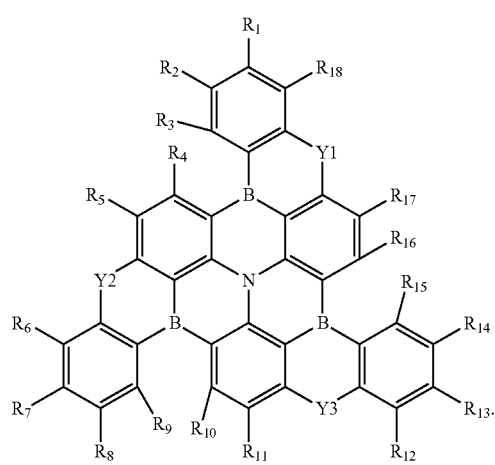

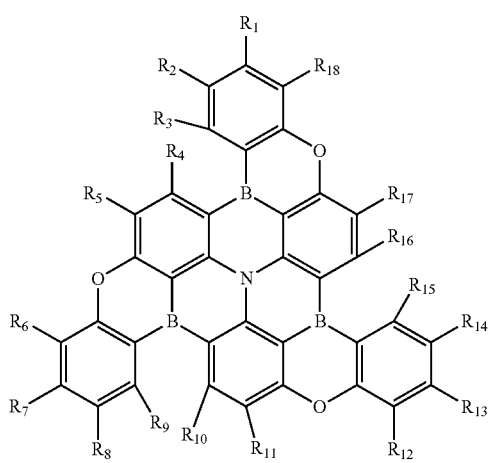

2-2

-continued 2-3

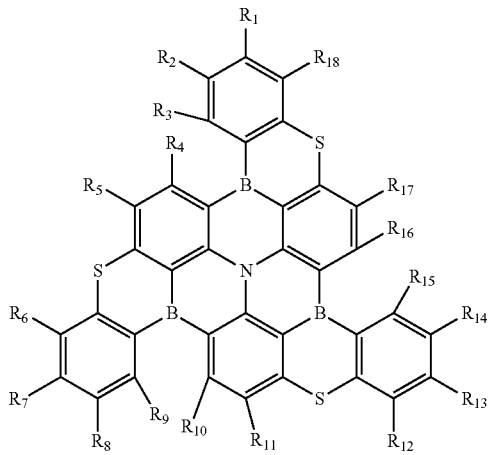

2-6

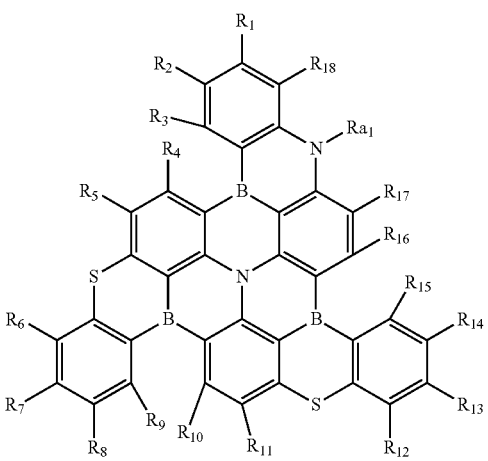

2-4

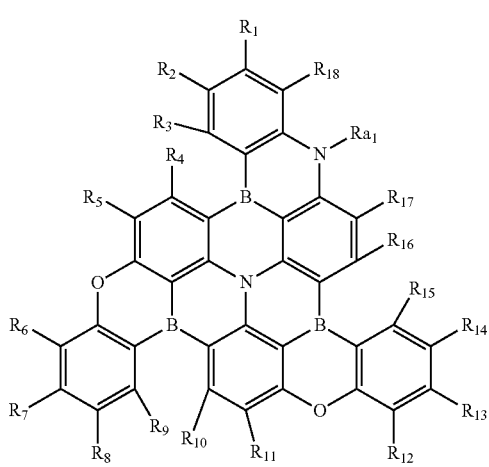

2-7

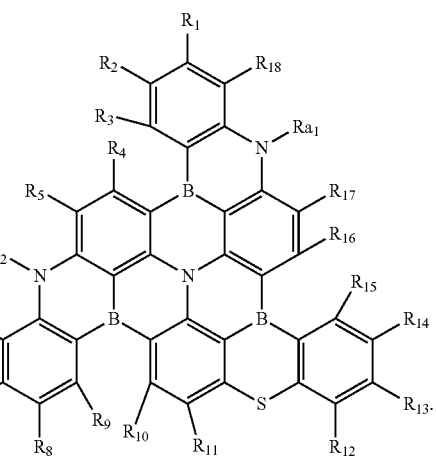

2-5

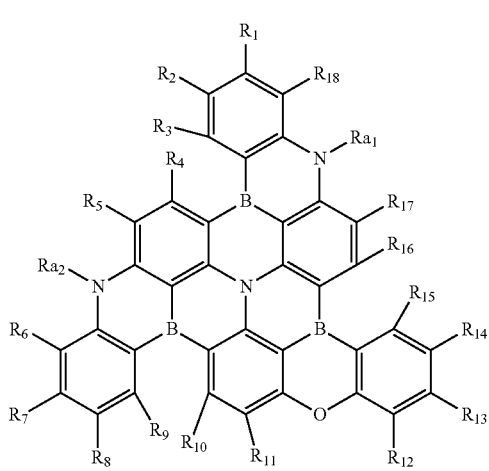

In Formulae 2-1 to 2-7, $Ra_1$, $Ra_2$, and $Ra_3$ may each independently be a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, or a substituted or unsubstituted heteroaryl group of 2 to 30 carbon atoms to form a ring.

In Formulae 2-1 to 2-7, $R_1$ to $R_{18}$ may each independently be a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group.

The polycyclic compound of an embodiment may be any one selected from the compounds represented in Compound Group 1. The organic electroluminescence device 10 of an embodiment may include at least one polycyclic compound selected from the polycyclic compounds represented in Compound Group 1 in an emission layer EML:

[Compound Group 1]
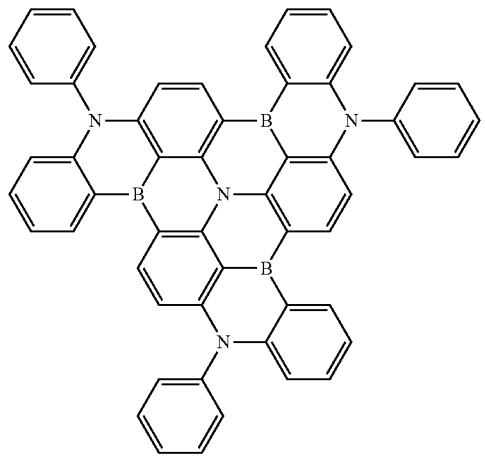 1
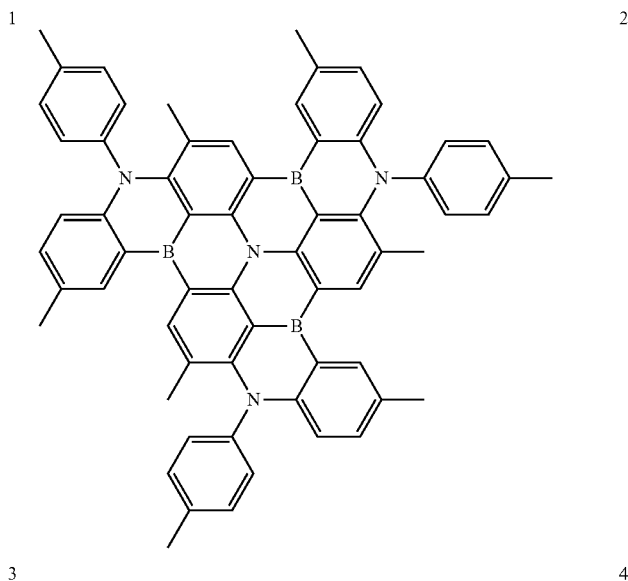 2
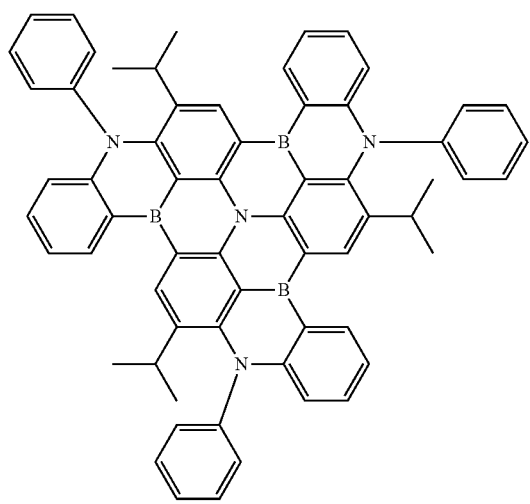 3
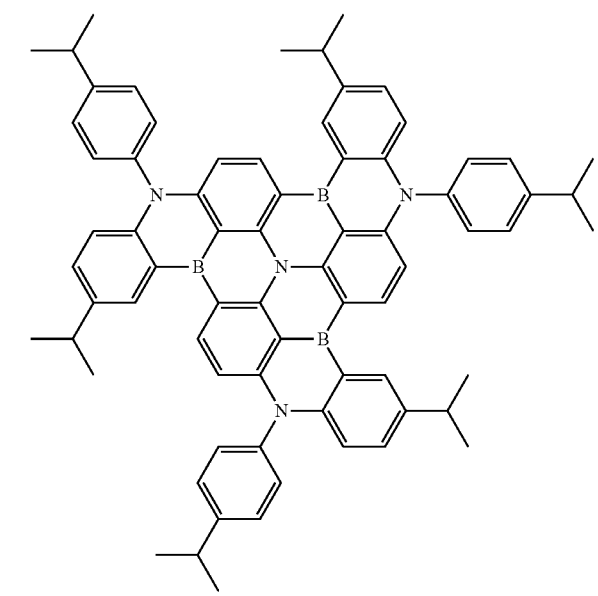 4
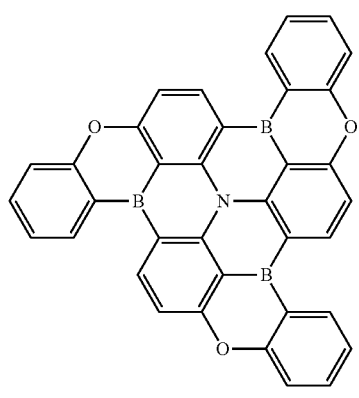 5
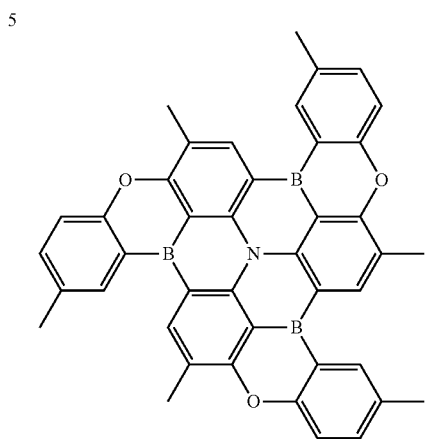 6

-continued
7
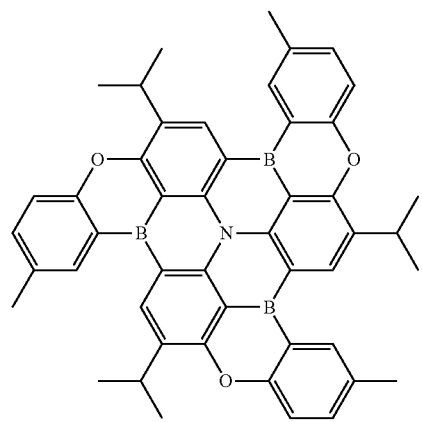
8
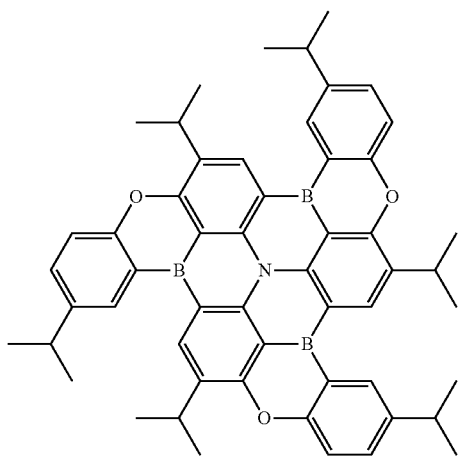
9
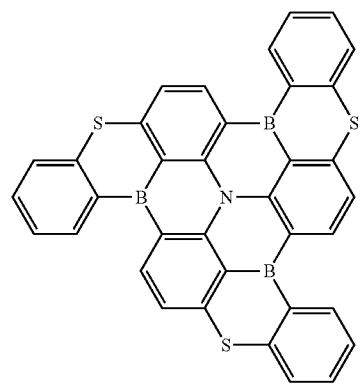
10
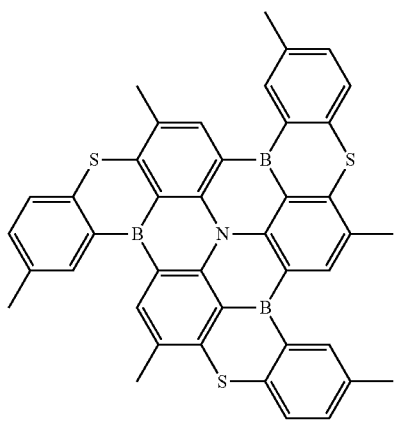
11
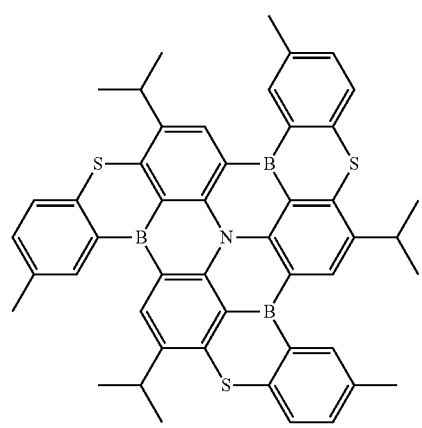
12
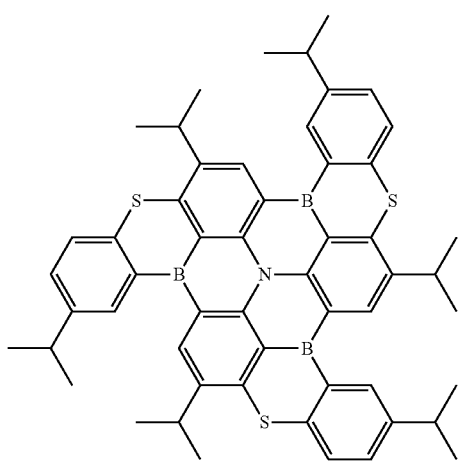

-continued
13
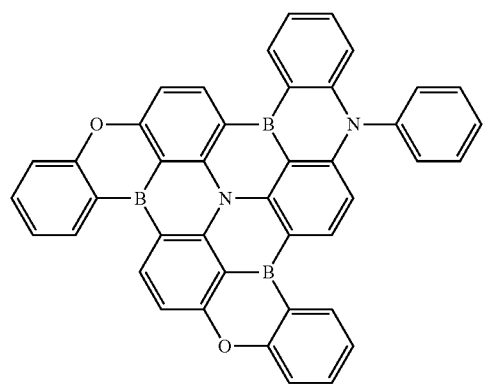
14
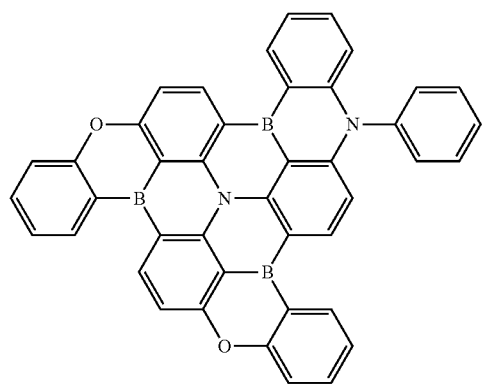
15
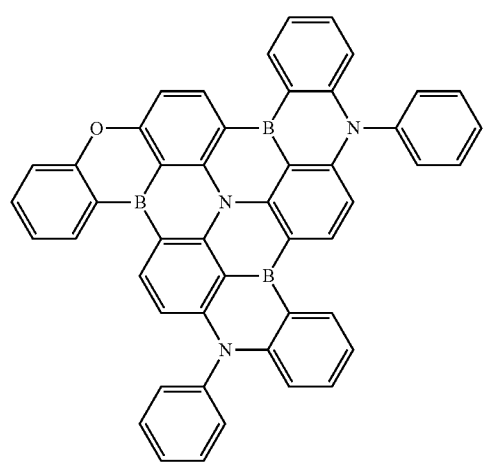
16
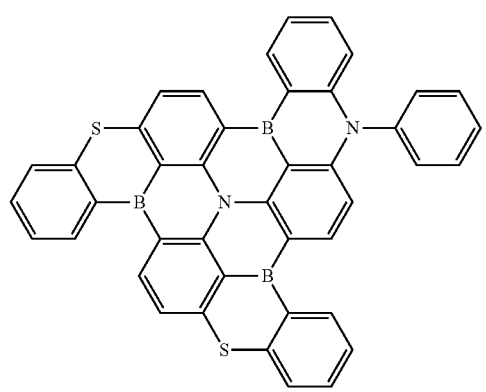
17
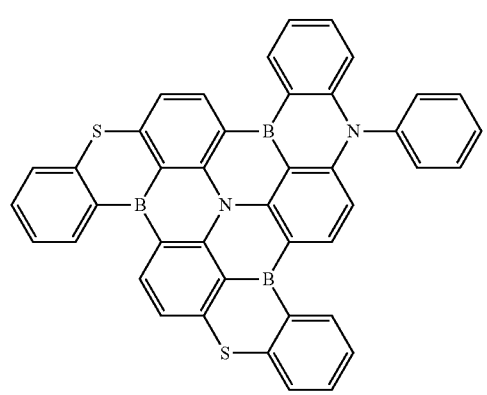
18
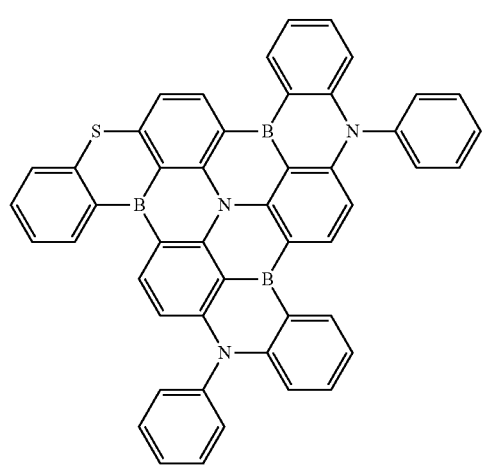

-continued
19
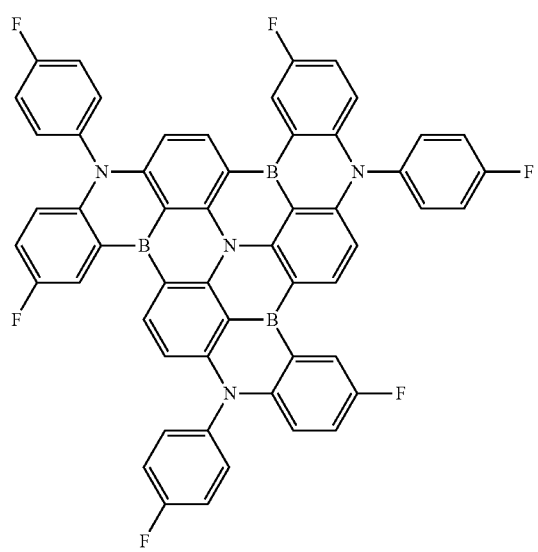
20
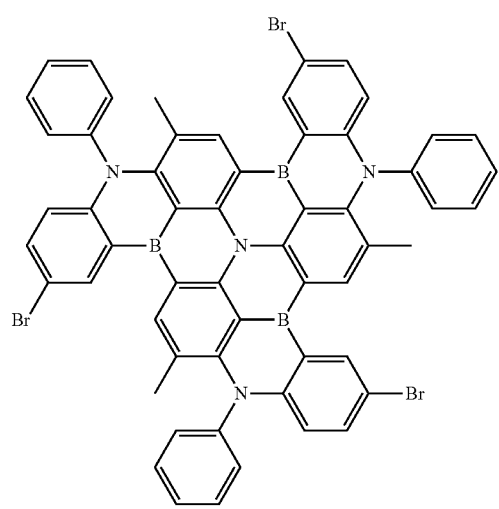
21
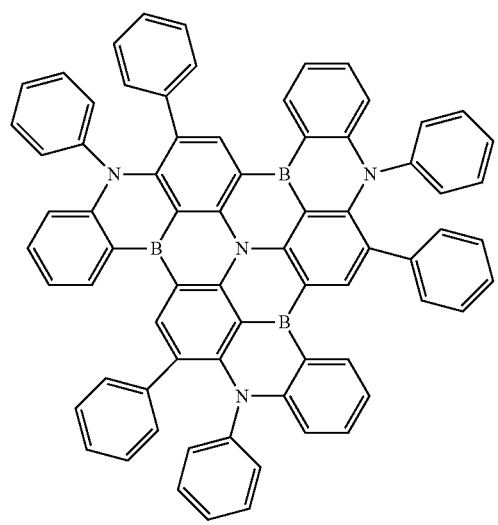
22
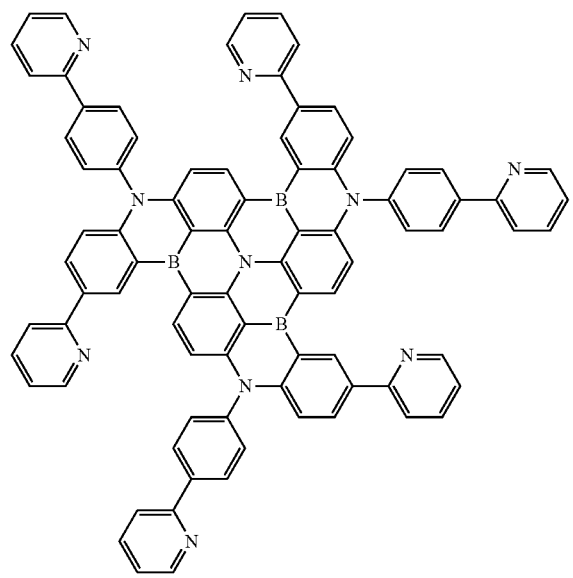
23
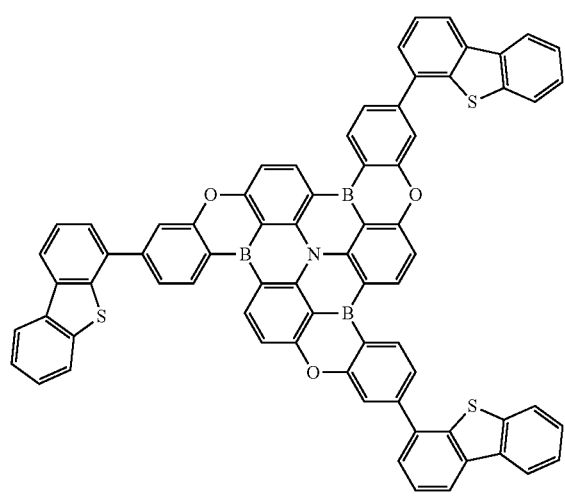
24
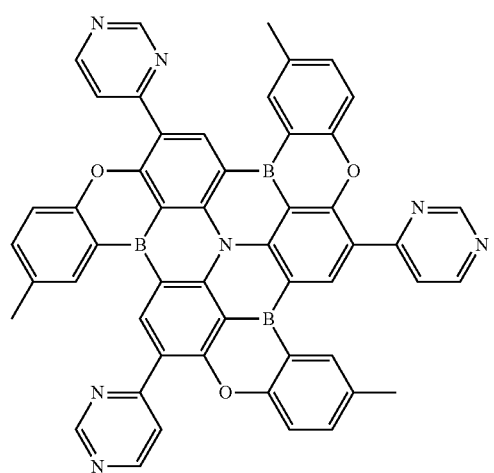

-continued
25
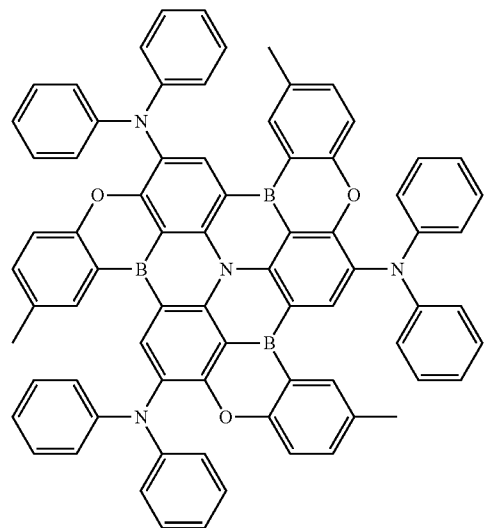
26
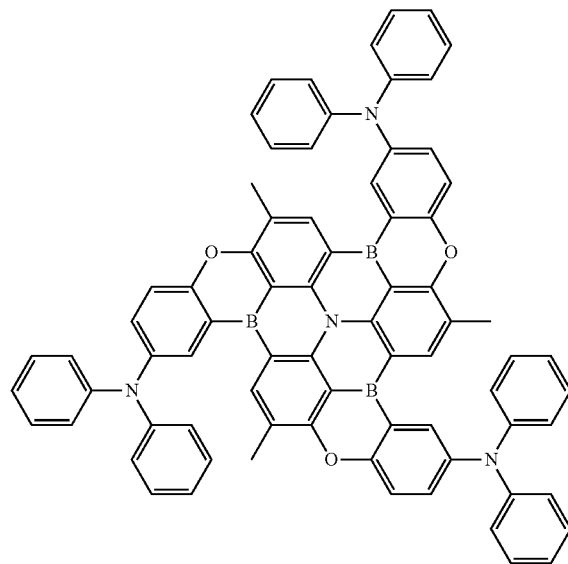
27
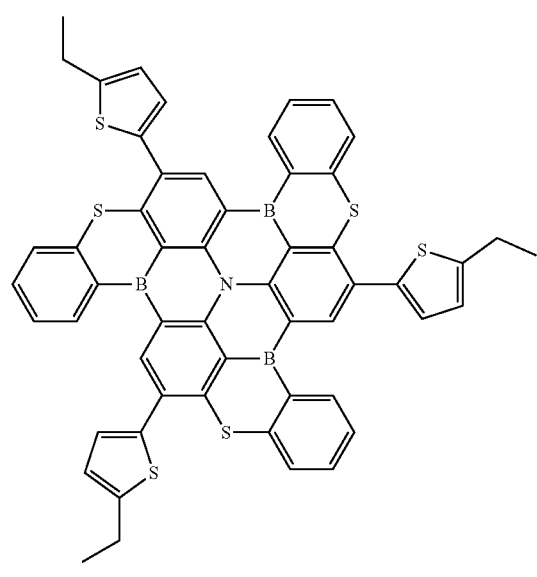
28
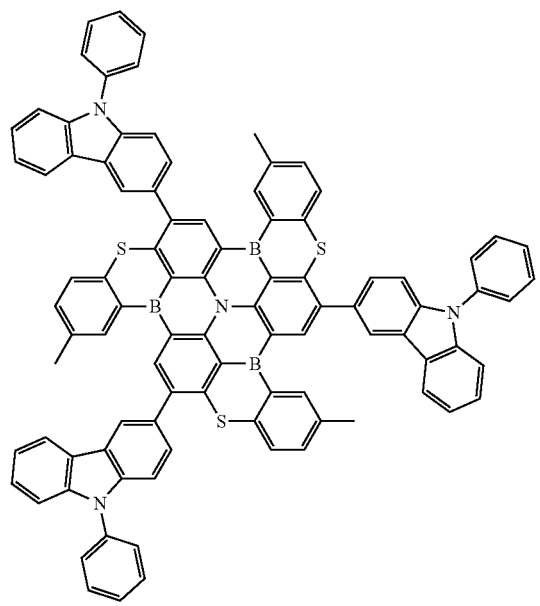

29
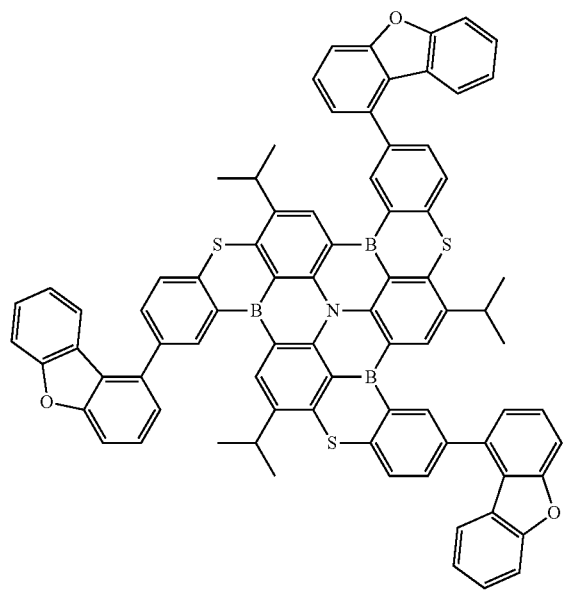
30
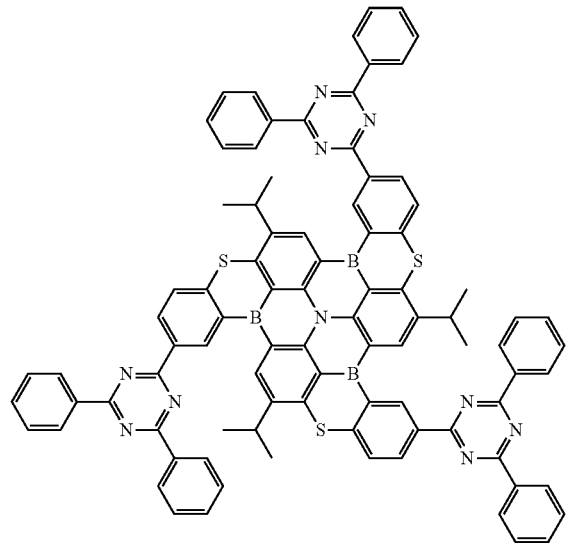
31
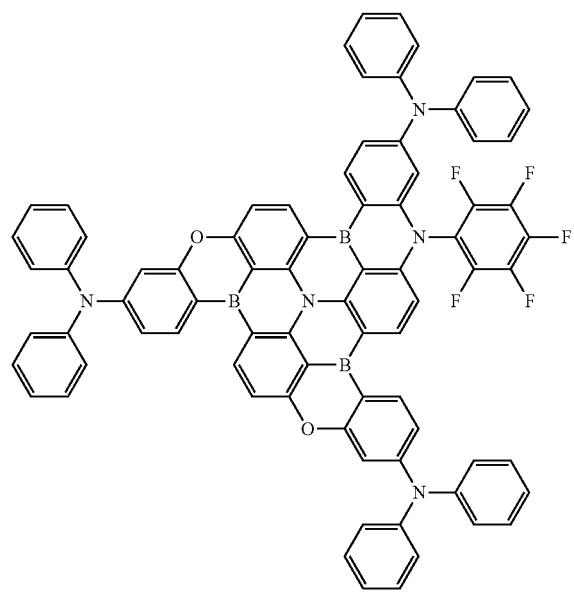
32
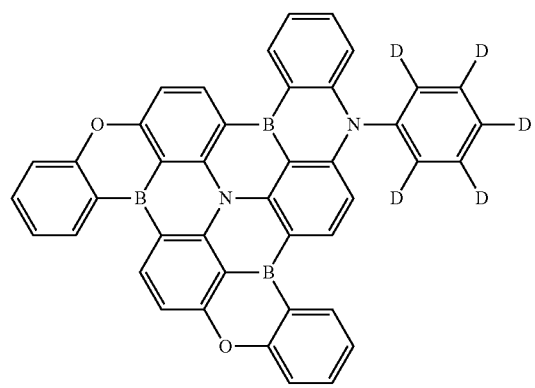

-continued
33
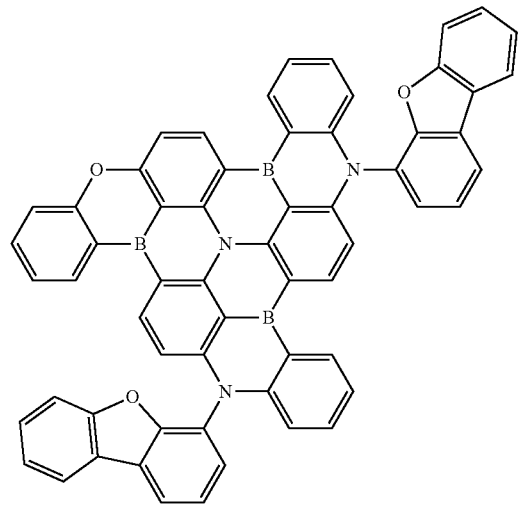
34
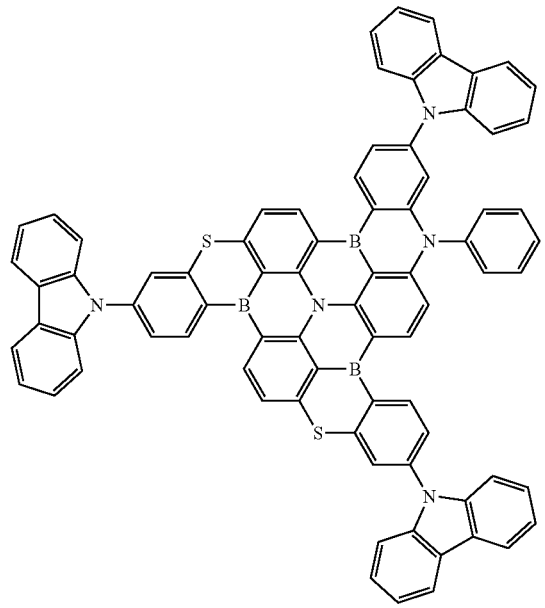
35
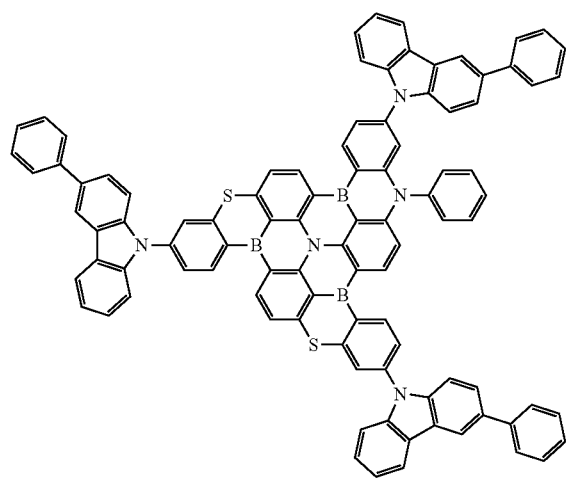
36
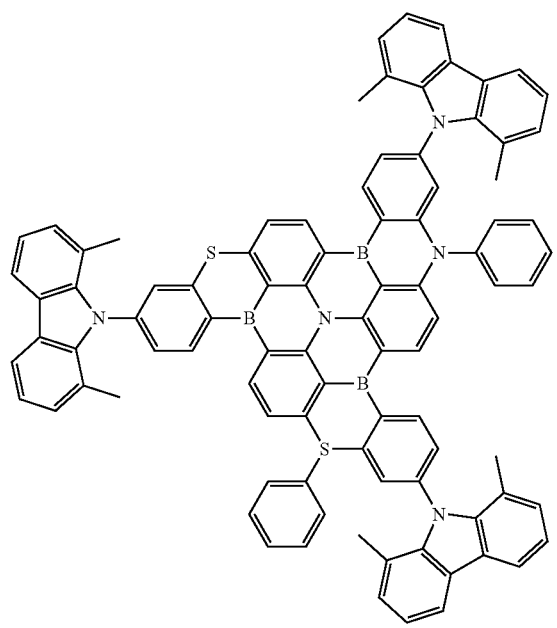

37
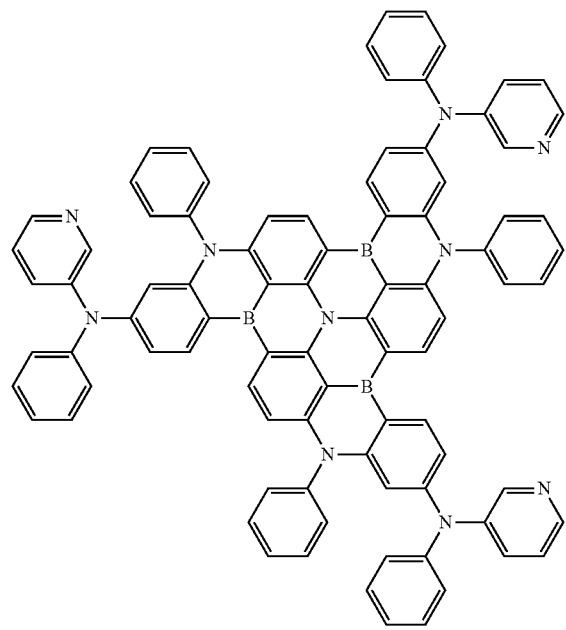
38
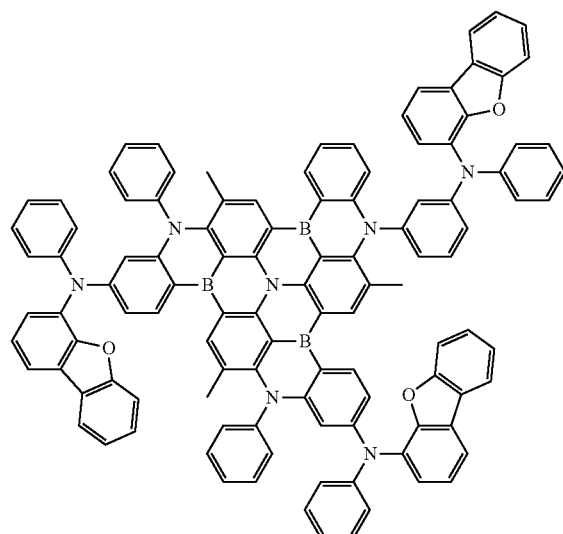
39
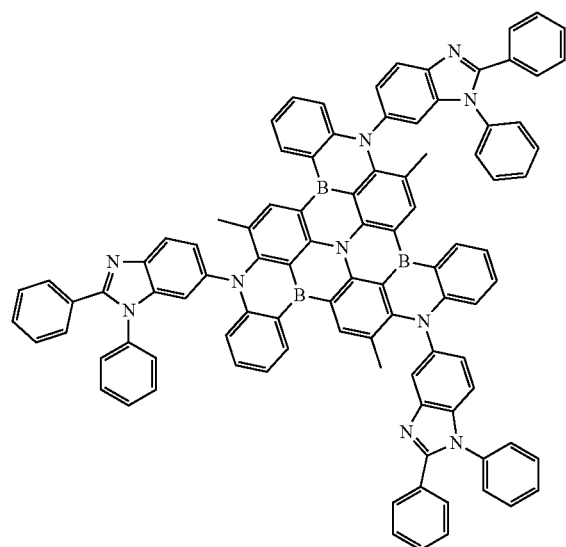
40
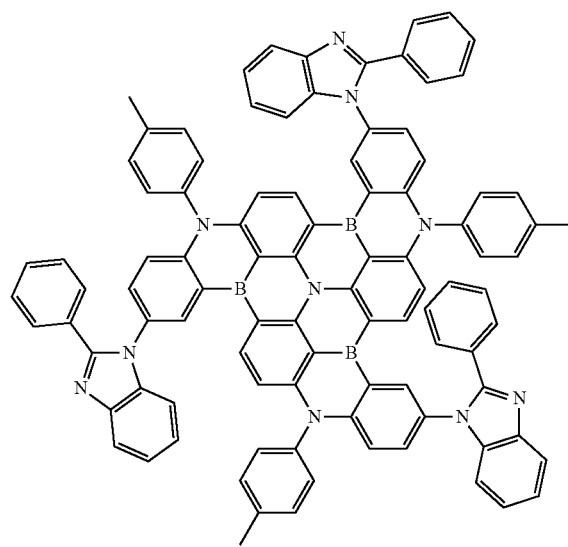

-continued
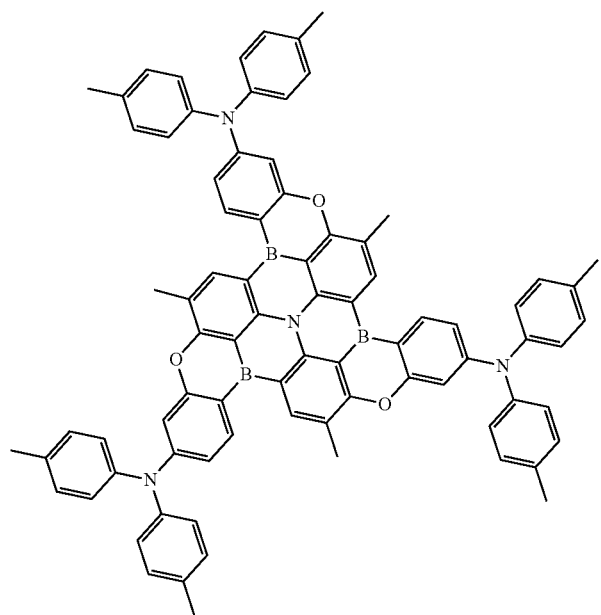
41
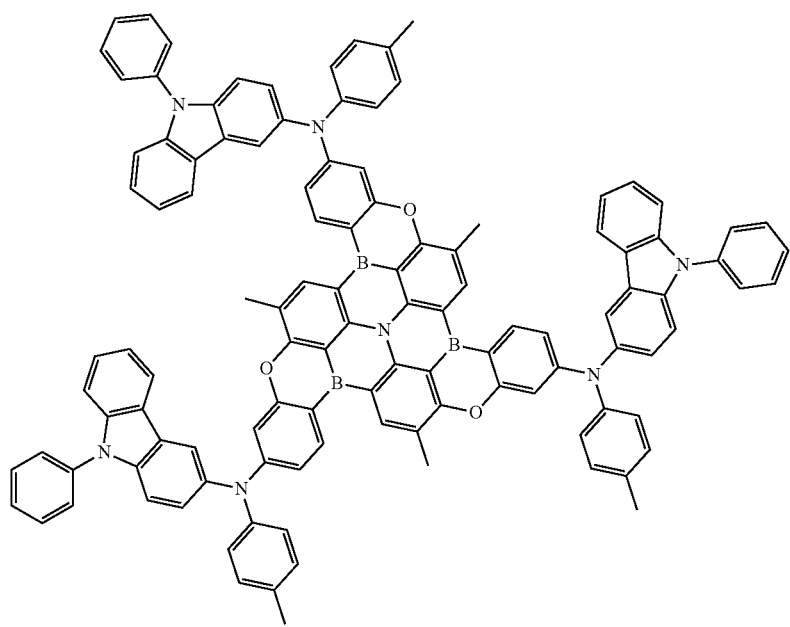
42

-continued

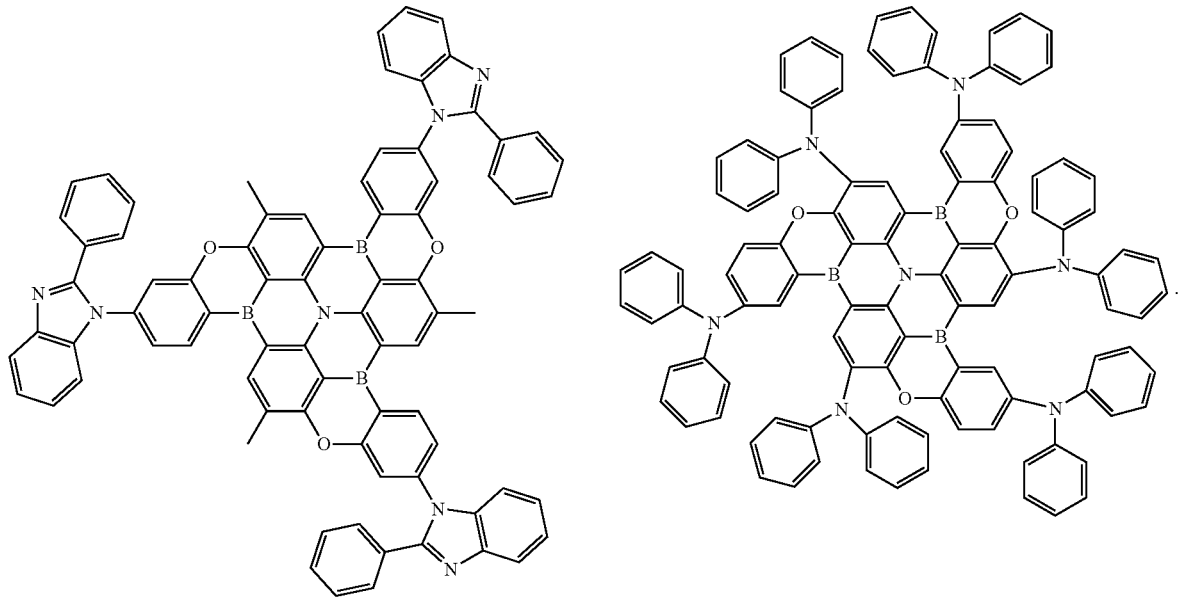

The polycyclic compound of an embodiment may be a material to emit thermally activated delayed fluorescence. The polycyclic compound of an embodiment includes aromatic rings combined with each other via linkers, and may thereby exhibit a high (e.g., relatively high or increased) lowest triplet ($T_1$) excitation energy level, and show a narrow full width at half maximum (FWHM) when emitting light (e.g., may be configured to emit light having a narrow FWHM). For example, the organic electroluminescence device of an embodiment includes the polycyclic compound of an embodiment in an emission layer and may show high efficiency and excellent color reproducibility.

The polycyclic compound of an embodiment represented by Formula 1 may be a blue thermally activated delayed fluorescence dopant.

In the organic electroluminescent device 10 of an embodiment, the emission layer EML may emit delayed fluorescence. For example, the emission layer EML may emit thermally activated delayed fluorescence (TADF).

The organic electroluminescence device 10 of an embodiment may include a plurality of emission layers. The plurality of emission layers may be laminated one by one and provided within the organic electroluminescence device 10. For example, the organic electroluminescence device 10 including a plurality of emission layers may be configured to emit white light. The organic electroluminescence device including the plurality of emission layers may be an organic electroluminescence device having a tandem structure. If the organic electroluminescence device 10 includes a plurality of emission layers, at least one emission layer EML may include the polycyclic compound of an embodiment.

In an embodiment, the emission layer EML includes a host and a dopant, and may include the polycyclic compound of an embodiment as a dopant. For example, in the organic electroluminescence device 10 of an embodiment, the emission layer EML may include a host to emit delayed fluorescence and a dopant to emit delayed fluorescence, and may include the polycyclic compound as a dopant to emit delayed fluorescence. The emission layer EML may include at least one selected from the polycyclic compounds represented in Compound Group 1 as a thermally activated delayed fluorescence dopant.

In an embodiment, the emission layer EML may be a delayed fluorescence emission layer, and the emission layer EML may include any suitable host material and the above-described polycyclic compound. For example, in an embodiment, the polycyclic compound may be used as a TADF dopant.

Meanwhile, in an embodiment, the emission layer EML may include any suitable host material. For example, in an embodiment, the emission layer EML may include tris(8-hydroxyquinolinato)aluminum ($Alq_3$), 4,4'-bis(N-carbazolyl)-1,1'-biphenyl (CBP), poly(N-vinylcarbazole) (PVK), 9,10-di(naphthalen-2-yl)anthracene (ADN), 4,4',4''-tris(carbazol-9-yl)-triphenylamine (TCTA), 1,3,5-tris(N-phenyl-benzimidazol-2-A benzene (TPBi), 3-tert-butyl-9,10-di(naphth-2-yl)anthracene (TBADN), distyrylarylene (DSA), 4,4'-bis(9-carbazolyl)-2,2"-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzo[b,d]furan (PPF), 3,3'-bis(N-carbazolyl)-1,1'-biphenyl (mCBP), and 1,3-bis(N-carbazolyl)benzene (mCP), etc., as a host material. However, an embodiment of the present disclosure is not limited thereto. Any suitable host materials capable of emitting delayed fluorescence may be included.

In the organic electroluminescence device 10 of an embodiment, the emission layer EML may further include any suitable dopant material. In an embodiment, the emission layer EML may include styryl derivatives (for example, 1,4-bis[2-(3-N-ethylcarbazoyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-Avinyl)phenyl)-N-phenylbenzenamine (N-BDAVBi)), perylene and derivatives thereof (for example, 2,5,8,11-tetra-t-butylperylene (TBP)), pyrene and derivatives thereof (for example, 1,1-dipyrene, 1,4-dipyrenylbenzene, 1,4-bis(N,N-diphenylamino)pyrene), etc. as a dopant.

In the organic electroluminescence device 10 of an embodiment, as shown in FIGS. 1 to 4, the electron transport region ETR is provided on the emission layer EML. The electron transport region ETR may include at least one selected from a hole blocking layer HBL, an electron transport layer ETL, and an electron injection layer EIL. However, an embodiment of the present disclosure is not limited thereto.

The electron transport region ETR may have or be a single layer formed using a single material, a single layer formed using a plurality of different materials, or a multilayer structure having a plurality of layers formed using a plurality of different materials.

For example, the electron transport region ETR may have a single layer structure of an electron injection layer EIL formed using an electron injection material, or a single layer structure of an electron transport layer ETL formed using an electron transport material. In some embodiments, the electron transport region ETR may have a single layer structure having a plurality of different materials, and in some embodiments, the electron transport region ETR may have a structure laminated from the emission layer EML of electron transport layer ETL/electron injection layer EIL, or hole blocking layer HBL/electron transport layer ETL/electron injection layer EIL, without limitation. The thickness of the electron transport region ETR may be, for example, about 1,000 Å to about 1,500 Å.

The electron transport region ETR may be formed using any suitable method such as a vacuum deposition method, a spin coating method, a cast method, a Langmuir-Blodgett (LB) method, an inkjet printing method, a laser printing method, and a laser induced thermal imaging (LITI) method.

When the electron transport region ETR includes an electron transport layer ETL, the electron transport region ETR may include an anthracene-based compound. The electron transport region may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq2), 9,10-di(naphthalene-2-yl)anthracene (ADN), 1,3-bis[3,5-di(pyridine-3-yl)phenyl]benzene (BmPyPhB), or a mixture thereof, without limitation. The thickness of the electron transport layer ETL may be about 100 Å to about 1,000 Å and may be, for example, about 150 Å to about 500 Å. When the thickness of the electron transport layer ETL satisfies the above-described range, satisfactory electron transport properties may be obtained without a substantial increase in driving voltage.

When the electron transport region ETR includes the electron injection layer EIL, the electron transport region ETR may include a metal halide (such as LiF, NaCl, CsF, RbCl, and/or RbI), a metal in lanthanide (such as Yb), a metal oxide (such as $Li_2O$ and/or BaO), or lithium quinolate (LiQ). However, an embodiment of the present disclosure is not limited thereto. In some embodiments, the electron injection layer EIL may be formed using a mixture of an electron transport material and an insulating organo metal salt. The organo metal salt may be a material having an energy band gap of about 4 eV or more. For example, the organo metal salt may include metal acetates, metal benzoates, metal acetoacetates, metal acetylacetonates, and/or metal stearates. The thickness of the electron injection layer EIL may be about 1 Å to about 100 Å, or about 3 Å to about 90 Å. When the thickness of the electron injection layer EIL satisfies the above described range, satisfactory electron injection properties may be obtained without a substantial increase in driving voltage.

The electron transport region ETR may include a hole blocking layer HBL as described above. The hole blocking layer HBL may include, for example, at least one selected from 2,9-dimethyl-4,7-diphenyl-1,10-phenanthroline (BCP) and 4,7-diphenyl-1,10-phenanthroline (Bphen). However, an embodiment of the present disclosure is not limited thereto.

The second electrode EL2 is provided on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may include or be formed of a transparent metal oxide, for example, ITO, IZO, ZnO, ITZO, etc.

When the second electrode EL2 is a transflective electrode or a reflective electrode, the second electrode EL2 may include or be formed of Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the second electrode EL2 may have a multilayered structure including a reflective layer or a transflective layer formed using the above-described materials and a transparent conductive layer formed using ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

In some embodiments, on the second electrode EL2 of the organic electroluminescence device 10 of an embodiment, a capping layer CPL may be further disposed. The capping layer CPL may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol-9-yl) triphenylamine (TCTA), and/or N,N'-bis(naphthalen-1-yl), etc.

The organic electroluminescence device 10 according to an embodiment of the present disclosure includes the polycyclic compound of an embodiment in the emission layer EML disposed between the first electrode EL1 and the second electrode EL2, and thereby exhibits excellent emission efficiency for blue light having a narrow full width at half maximum. For example, the polycyclic compound according to an embodiment may be configured to emit thermally activated delayed fluorescence, and the emission layer EML may include the polycyclic compound of an embodiment to emit thermally activated delayed fluorescence and show high emission efficiency properties.

Meanwhile, the compound of an embodiment may be included in an organic layer other than the emission layer EML as a material for the organic electroluminescence device 10. For example, the organic electroluminescence device 10 according to an embodiment of the present disclosure may include the compound in at least one functional layer disposed between the first electrode EL1 and the second electrode EL2, and/or in the capping layer (CPL) disposed on the second electrode EL2.

The polycyclic compound of an embodiment has a combined (e.g., fused ring) structure formed of interconnected aromatic rings including both N and B as ring-forming heteroatoms, and may show a higher (increased) lowest triplet excitation energy level and be used as a material to emit delayed fluorescence. For example, the organic electroluminescence device of an embodiment including the polycyclic compound of an embodiment in the emission layer emits blue light having a narrow full width at half maximum and high efficiency properties.

Hereinafter, the polycyclic compound according to an embodiment and the organic electroluminescence device of an embodiment of the present disclosure will be explained in more detail by referring to embodiments and comparative embodiments. The following embodiments are only illustrations to assist the understanding of the present disclosure, and the scope of the present disclosure is not limited thereto.

Examples

1. Synthesis of Polycyclic Compound

First, the synthetic method of the polycyclic compounds according to example embodiments will be explained by referring to the synthetic methods of Compound 2, Compound 6, and Compound 8. The synthetic methods of the polycyclic compounds explained below are only embodiments, and synthetic methods of the polycyclic compound according to an embodiment of the present disclosure are not limited thereto.

(1) Synthesis of Compound 2

Compound 2 according to an embodiment may be synthesized, for example, by the steps (acts) of Reaction 1-1 to Reaction 1-4:

Synthesis of Intermediate Compound 2-A

Intermediate Compound 2-A was synthesized by the steps (acts) of Reaction 1-1 to Reaction 1-3:

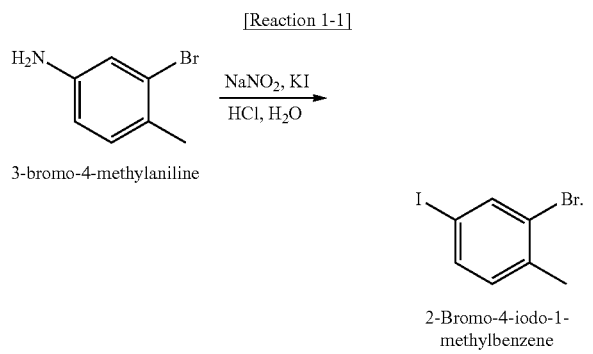

3-bromo-4-methylaniline (50.0 g, 268.7 mmol) was placed in a three-neck flask and HCl (200 mL) was added, followed by heating and stirring at about 60° C. for about 1 hour. Then, the temperature was decreased to about 0° C., NaNO$_2$ (20.4 g, 295.6 mmol) dissolved in 40 mL of water was added dropwisely thereto, and stirring was carried out for about 1 hour. After that, KI (49.1 g, 295.6 mmol) dissolved in 20 mL of water was added dropwisely thereto, followed by heating and stirring at about 60° C. for about 4 hours. Water and toluene were added to the reaction solution, and an organic layer and an aqueous layer were separated. The organic layer was concentrated to obtain 2-bromo-4-iodo-1-methylbenzene (34.7 g, yield 43%). The measured value of the molecular weight of 2-bromo-4-iodo-1-methylbenzene measured by FAB-MS was m/z=296 (M$^+$+1).

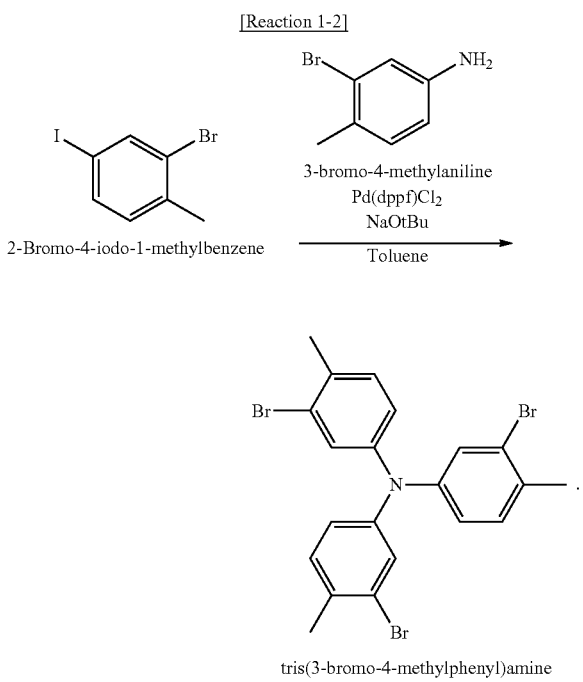

2-bromo-4-iodo-1-methylbenzene (30.3 g, 102.1 mmol), 3-bromo-4-methylaniline (9.5 g, 51.1 mmol), Pd(dppf)Cl$_2$ (0.2 g, 0.5 mmol), and t-BuONa (12.3 g, 127.7 mmol) were placed in a three-neck flask under an argon atmosphere, and toluene (500 mL) was added, followed by heating and stirring at about 130° C. for about 12 hours. Water and toluene were added to the reaction solution, and an organic layer and an aqueous layer were separated. The organic layer was concentrated. The solid obtained by the concentration was separated by column chromatography (hexane:toluene=3:1) to obtain tris(3-bromo-4-methylphenyl)amine (17.1 g, yield 64%). The measured value of the molecular weight of tris(3-bromo-4-methylphenyl)amine measured by FAB-MS was m/z=524 (M$^+$+1).

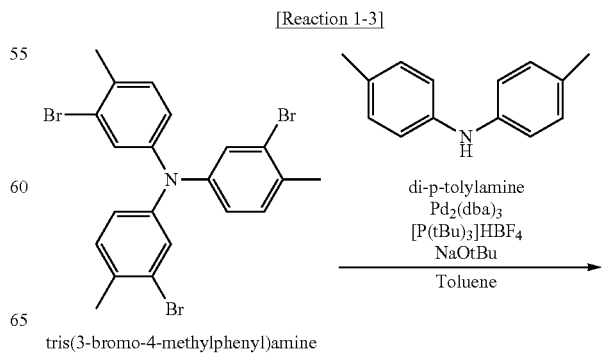

-continued

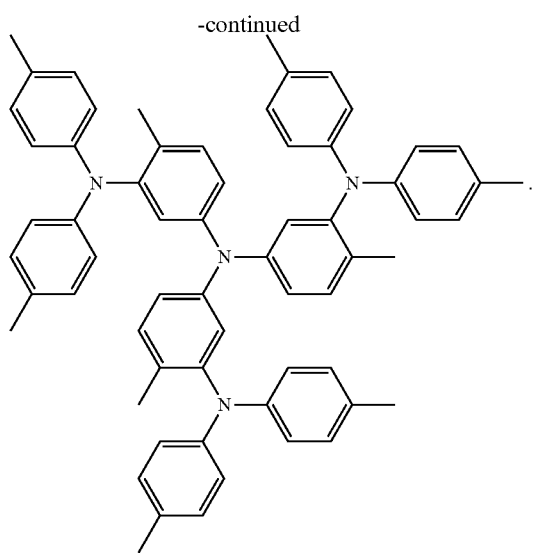

2-A tris(3-bromo-4-methylphenyl)amine (10.0 g, 19.1 mmol), di-p-tolylamine (11.7 g, 59.2 mmol), Pd$_2$(dba)$_3$ (1.0 g, 1.1 mmol), [P(tBu)$_3$]HBF$_4$ (1.3 g, 4.6 mmol), and t-BuONa (8.3 g, 85.9 mmol) were placed in a three-neck flask under an argon atmosphere, and toluene (500 mL) was added, followed by heating and stirring at about 130° C. for about 4 hours. Water and toluene were added to the reaction solution, and an organic layer and an aqueous layer were separated. The organic layer was concentrated. The solid obtained by the concentration was separated by column chromatography (hexane:toluene=3:1) to obtain Intermediate Compound 2-A (16.1 g, yield 84%). The measured value of the molecular weight of Intermediate Compound 2-A measured by FAB-MS was m/z=873 (M$^+$+1).

Synthesis of Compound 2

[Reaction 1-4]

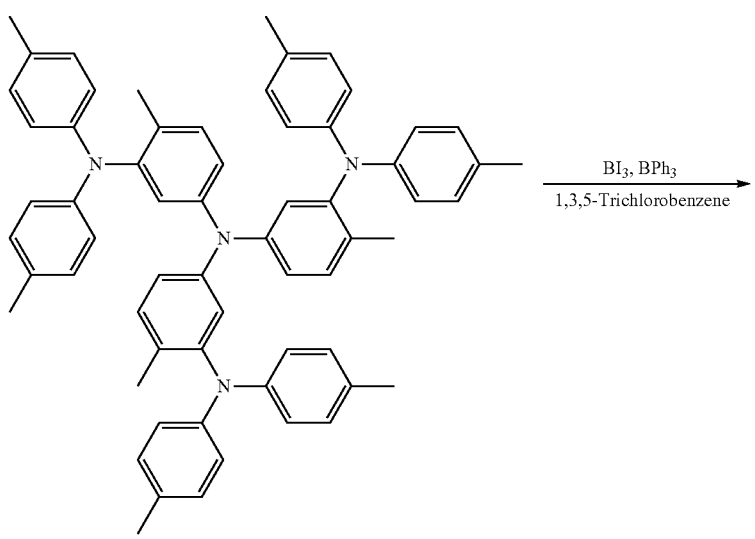

2-A

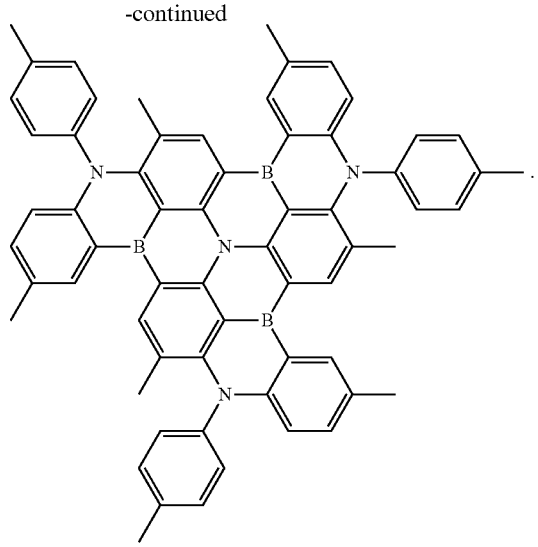

2

Intermediate Compound 2-A (2.0 g, 2.3 mmol), BPh$_3$ (1.1 g, 4.5 mmol), and BI$_3$ (4.5 g, 11 mmol) were placed in a three-neck flask under an argon atmosphere and 1,3,5-trichlorobenzene (200 mL) was added, followed by heating and stirring at about 180° C. for about 6 hours. Water and toluene were added to the reaction solution, and an organic layer and an aqueous layer were separated. The organic layer was concentrated. The solid obtained by the concentration was washed with ultrasonic waves using a mixture solvent of hexane/toluene and recrystallized with toluene to obtain Compound 2 (1.2 g, yield 51%). The measured value of the molecular weight of Compound 2 measured by FAB-MS was m/z=897 (M$^+$+1).

(2) Synthesis of Compound 6

Compound 6 according to an embodiment may be synthesized, for example, by the steps (acts) of Reaction 2-1 to Reaction 2-4:

Synthesis of Intermediate Compound 6-A

Intermediate Compound 6-A was synthesized by the steps (acts) of Reaction 2-1 to Reaction 2-3:

[Reaction 2-1]

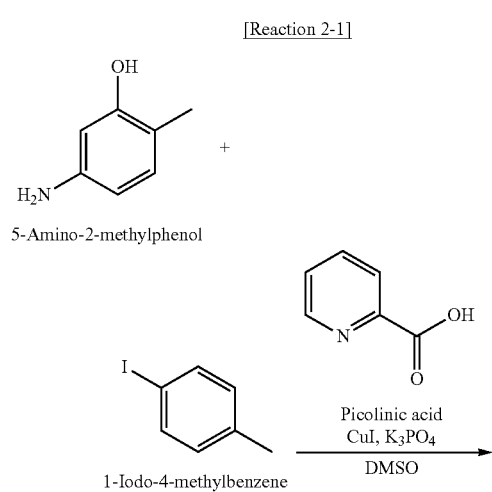

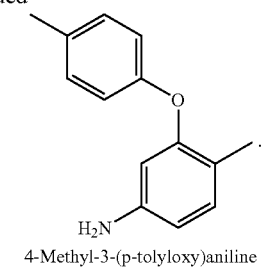

4-Methyl-3-(p-tolyloxy)aniline 5-amino-2-methylphenol (14.8 g, 120.0 mmol), 1-iodo-4-methylbenzene(26.2 g, 120 mmol), picolinic acid (1.65 g, 12.4 mmol), CuI (1.2 g, 6.1 mmol), and K$_3$PO$_4$ (51.7 g, 243.6 mmol) were placed in a three-neck flask under an argon atmosphere and DMSO (800 mL) was added, followed by heating and stirring at about 130° C. for about 6 hours. Water and toluene were added to the reaction solution, and an organic layer and an aqueous layer were separated. The organic layer was concentrated. The solid obtained by the concentration was separated by column chromatography (hexane:toluene=3:1) to obtain 4-methyl-3-(p-tolyloxy)aniline(20 g, yield 62%). The measured value of the molecular weight of 4-methyl-3-(p-tolyloxy)aniline measured by FAB-MS was m/z=213.3 (M$^+$+1).

[Reaction 2-2]

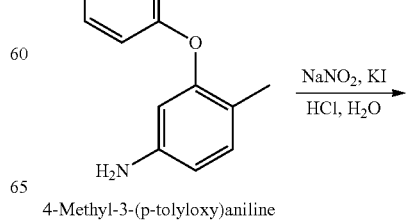

4-Methyl-3-(p-tolyloxy)aniline

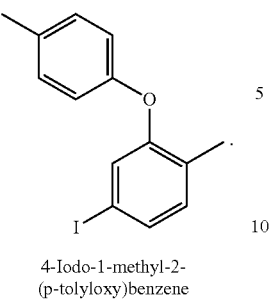

4-Iodo-1-methyl-2-
(p-tolyloxy)benzene 4-methyl-3-(p-tolyloxy)aniline (12.0 g, 56.3 mmol) was placed in a three-neck flask and HCl (100 mL) was added, followed by heating and stirring at about 60° C. for about 1 hour. Then, the temperature was decreased to about 0° C. and NaNO$_2$ (4.2 g, 61.9 mmol) dissolved in 20 mL of water was added dropwisely thereto, and stirring was carried out for about 1 hour. After that, KI (10.3 g, 61.9 mmol) dissolved in 10 mL of water was added dropwisely thereto, followed by heating and stirring at about 60° C. for about 6 hours. Water and toluene were added to the reaction solution, and an organic layer and an aqueous layer were separated. The organic layer was concentrated to obtain 4-iodo-1-methyl-2-(p-tolyloxy)benzene (10.7 g, yield 59%). The measured value of the molecular weight of 4-iodo-1-methyl-2-(p-tolyloxy)benzene measured by FAB-MS was m/z=325 (M$^+$+1).

[Reaction 2-3]

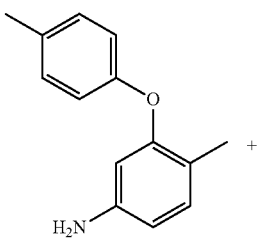

4-Methyl-3-(p-tolyloxy)aniline

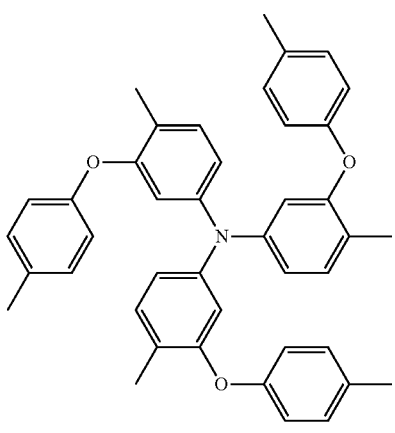

6-A 4-methyl-3-(p-tolyloxy)aniline (2.9 g, 13.6 mmol), 4-iodo-1-methyl-2-(p-tolyloxy)benzene (8.8 g, 27.2 mmol), Pd$_2$(dba)$_3$ (0.7 g, 0.8 mmol), [P(tBu)$_3$]HBF$_4$ (0.95 g, 3.3 mmol), and t-BuONa (5.9 g, 27.2 mmol) were placed in a three-neck flask under an argon atmosphere, and toluene (300 mL) was added, followed by heating and stirring at about 130° C. for about 6 hours. Water and toluene were added to the reaction solution, and an organic layer and an aqueous layer were separated. The organic layer was concentrated. The solid obtained by the concentration was separated by column chromatography (hexane:toluene=3:1) to obtain Intermediate Compound 6-A (7.4 g, yield 90%). The measured value of the molecular weight of Intermediate Compound 6-A measured by FAB-MS was m/z=606 (M$^+$+1).

Synthesis of Compound 6

[Reation 2-4]

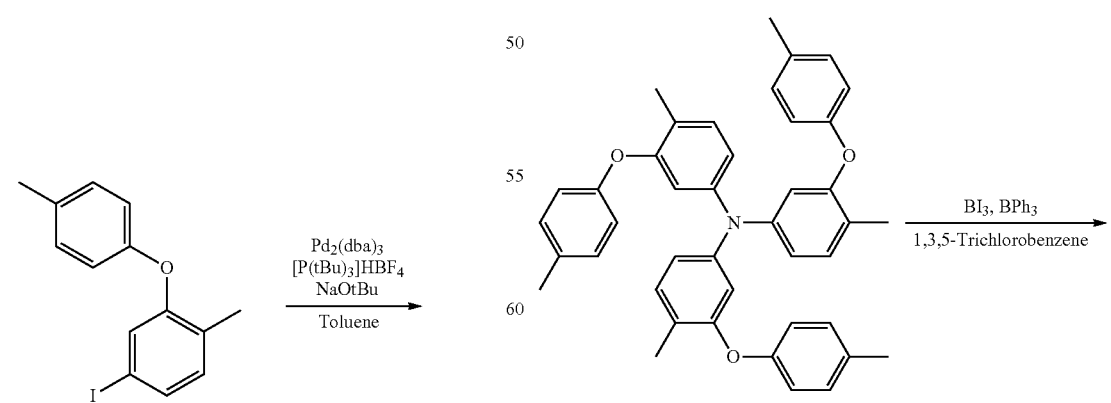

Intermediate Compound 6-A (2.0 g, 3.3 mmol), BPh₃ (2.4 g, 9.9 mmol), and BI 3 (8.4 g, 21.5 mmol) were placed in a three-neck flask under an argon atmosphere and 1,3,5-trichlorobenzene (200 mL) was added, followed by heating and stirring at about 180° C. for about 6 hours. Water and toluene were added to the reaction solution, and an organic layer and an aqueous layer were separated. An organic layer was concentrated. The solid obtained by the concentration was sonicated in a mixed solvent of hexane/toluene and recrystallized with toluene to obtain Compound 6 (1.6 g, yield 90%). The measured value of the molecular weight of Compound 6 measured by FAB-MS was m/z=630 (M⁺+1).

(3) Synthesis of Compound 8

Compound 8 according to an embodiment may be synthesized, for example, by the steps (acts) of Reaction 3-1 to Reaction 3-4:

Synthesis of Intermediate Compound 8-A

Intermediate Compound 8-A was synthesized by the steps (acts) of Reaction 3-1 to Reaction 3-3:

5-amino-2-isopropylphenol (18.1 g, 120.0 mmol), 1-iodo-4-isopropylbenzene (29.5 g, 120 mmol), picolinic acid (1.65 g, 12.4 mmol), CuI (1.2 g, 6.1 mmol), and K₃PO₄ (51.7 g, 243.6 mmol) were placed in a three-neck flask under an argon atmosphere and DMSO (800 mL) was added, followed by heating and stirring at about 130° C. for about 6 hours. Water and toluene were added to the reaction solution, and an organic layer and an aqueous layer were separated. The organic layer was concentrated. The solid obtained by the concentration was separated by column chromatography (hexane:toluene=3:1) to obtain 4-isopropyl-3-(4-isopropylphenoxy)aniline (20 g, yield 62%). The measured value of the molecular weight of 4-isopropyl-3-(4-isopropylphenoxy)aniline measured by FAB-MS was m/z=269 (M⁺+1).

4-isopropyl-3-(4-isopropylphenoxy)aniline (15 g, 56.3 mmol) was placed in a three-neck flask and HCl (100 mL) was added, followed by heating and stirring at about 60° C. for about 1 hour. Then, the temperature was decreased to about 0° C. and NaNO₂ (4.2 g, 61.9 mmol) dissolved in 20 mL of water was added dropwisely thereto, and stirring was carried out for about 1 hour. After that, KI (10.3 g, 61.9 mmol) dissolved in 10 mL of water was added dropwisely thereto, followed by heating and stirring at about 60° C. for about 6 hours. Water and toluene were added to the reaction solution, and an organic layer and an aqueous layer were separated. The organic layer was concentrated to obtain 4-iodo-1-isopropyl-2-(4-isopropylphenoxy)benzene (9.8 g, yield 46%). The measured value of the molecular weight of 4-iodo-1-isopropyl-2-(4-isopropylphenoxy)benzene measured by FAB-MS was m/z=381 (M$^+$+1).

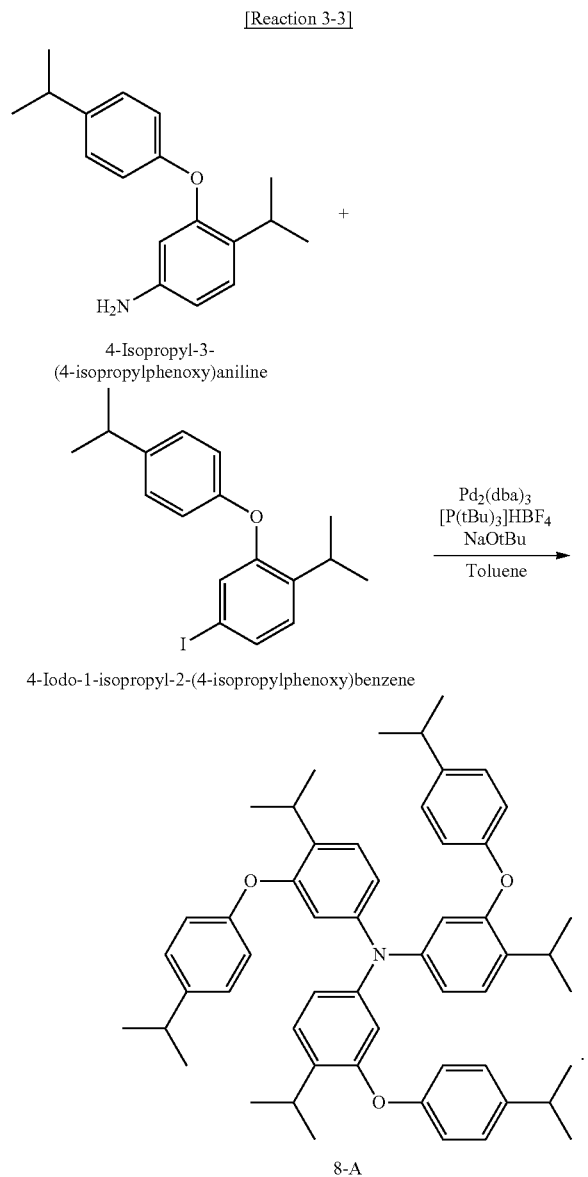

4-isopropyl-3-(4-isopropylphenoxy)aniline (3.2 g, 12.0 mmol), 4-iodo-1-isopropyl-2-(4-isopropylphenoxy)benzene (9.1 g, 24.0 mmol), Pd$_2$(dba)$_3$ (0.7 g, 0.8 mmol), [P(tBu)$_3$]HBF$_4$ (0.95 g, 3.3 mmol), and t-BuONa (5.9 g, 27.2 mmol) were placed in a three-neck flask under an argon atmosphere, and toluene (300 mL) was added, followed by heating and stirring at about 130° C. for about 6 hours. Water and toluene were added to the reaction solution, and an organic layer and an aqueous layer were separated. The organic layer was concentrated. The solid obtained by the concentration was separated by column chromatography (hexane:toluene=3:1) to obtain Intermediate Compound 8-A (6.0 g, yield 64%). The measured value of the molecular weight of Intermediate Compound 8-A measured by FAB-MS was m/z=774 (M$^+$+1).

Synthesis of Compound 8

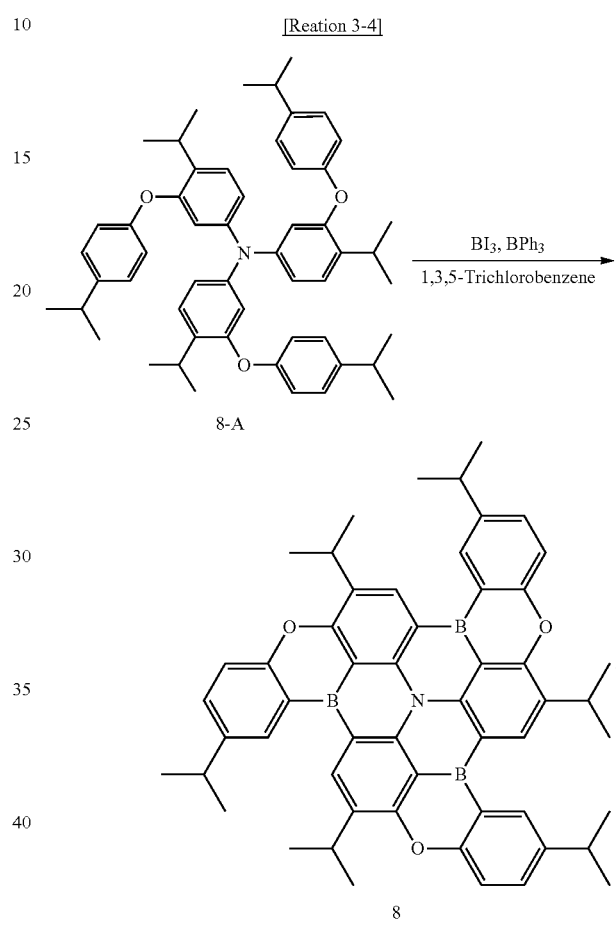

Intermediate Compound 8-A (2.3 g, 3.0 mmol), BPh$_3$ (2.4 g, 9.9 mmol), and BI$_3$ (8.4 g, 21.5 mmol) were placed in a three-neck flask under an argon atmosphere and 1,3,5-trichlorobenzene (200 mL) was added, followed by heating and stirring at about 180° C. for about 6 hours. Water and toluene were added to the reaction solution, and an organic layer and an aqueous layer were separated. The organic layer was concentrated. The solid obtained by the concentration was washed with ultrasonic waves using a mixture solvent of hexane/toluene and recrystallized with toluene to obtain Compound 8 (1.3 g, yield 54%). The measured value of the molecular weight of Compound 8 measured by FAB-MS was m/z=797.4 (M$^+$+1).

2. Evaluation of Polycyclic Compound and Manufacture and Evaluation Organic Electroluminescence Device The light-emitting properties of the polycyclic compound of an embodiment, and the organic electroluminescence device of an embodiment including the polycyclic compound of an embodiment in an emission layer, were evaluated by methods described below. The manufacturing method of an organic electroluminescence device for the device evaluation is described below.

The organic electroluminescence devices of Example 1 to Example 3 were manufactured using the polycyclic compounds of Compounds 2, 6, and 8, respectively, as dopant materials in an emission layer. The organic electroluminescence devices of Comparative Example 1 to Comparative Example 3 were manufactured using Comparative Compounds C1, C2, and C3, respectively, as dopant materials in an emission layer.

The compounds used in Example 1 to Example 3, and Comparative Example 1 to Comparative Example 3 are shown in Table 1:

TABLE 1

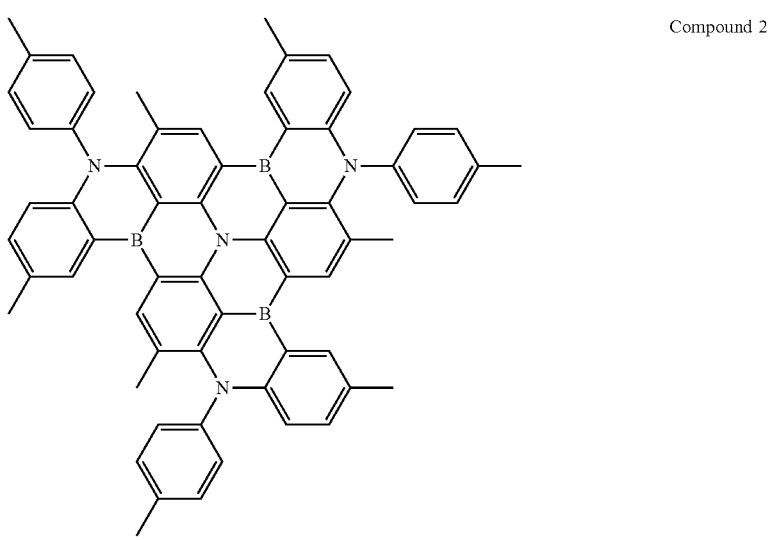

Compound 2

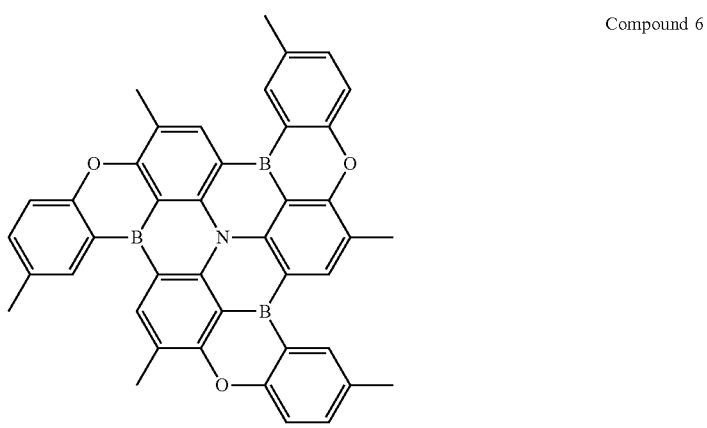

Compound 6

TABLE 1-continued

Compound 8

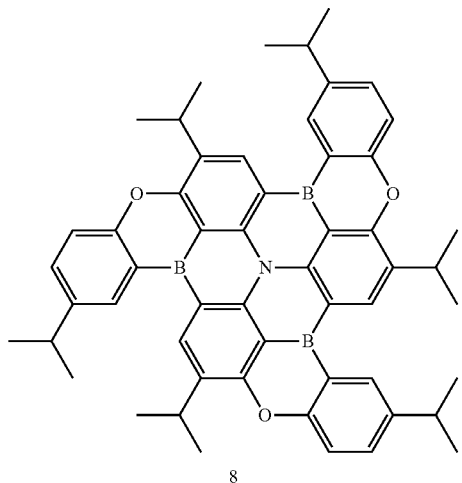 [SMILES: CC(C)c1ccc2c(c1)B1c3cc(C(C)C)c4c5c3N3c6c(cc(C(C)C)c(c61)O2)B1c2cc(C(C)C)ccc2Oc2c(C(C)C)cc(c3c21)B5c1cc(C(C)C)ccc1O4]

8

Comparative Compound C1

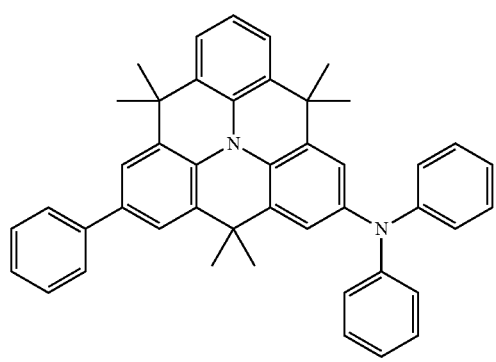

C1

Comparative Compound C2

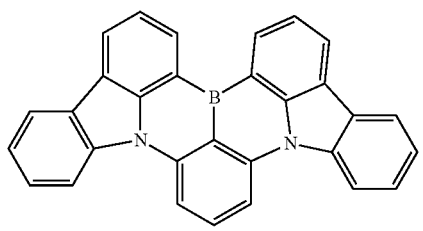

C2

Comparative Compound C3

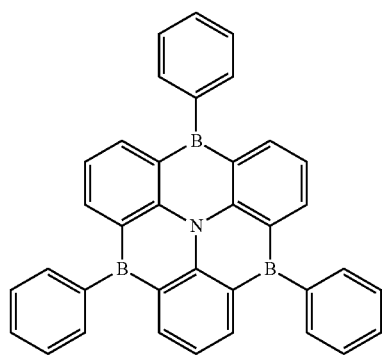

C3

(Evaluation of Light-Emitting Properties of Compound)

5.0 mM toluene solutions were prepared using each of the Example Compounds and Comparative Compounds, and the light-emitting properties (e.g., emission spectra) of each was evaluated using a JASCO V-670 spectrometer. The emission spectrum was measured at room temperature and 77K. In Table 2, the maximum emission wavelength λmax in the emission spectrum and a full width at half maximum in the emission spectrum measured at room temperature are shown. The $T_1$ level was calculated from the onset value of the emission spectrum at 77K.

TABLE 2

| Compound | $\lambda_{max}$ (nm) | FWHM (nm) | $T_1$ level (eV) |
|---|---|---|---|
| Compound 2 | 464 | 32 | 2.68 |
| Compound 6 | 445 | 33 | 2.78 |
| Compound 8 | 450 | 24 | 2.69 |
| Comparative Compound C1 | 442 | 64 | 2.32 |
| Comparative Compound C2 | 475 | 25 | 2.57 |
| Comparative Compound C3 | 469 | 40 | 2.60 |

Referring to the results of Table 2, Compounds 2, 6, and 8, which were the polycyclic compounds of the Examples showed a maximum light-emitting wavelength of about 465 nm or less, corresponding to deep blue light. In addition, it was found that in the emission spectrum of Compounds 2, 6 and 8, which were the polycyclic compounds of the Examples, showed narrow full width at half maximum (FWHM) of about 35 nm or less.

Comparative Compound C1 showed a maximum light-emitting wavelength in a similar wavelength region, but with a large full width at half maximum and emitted light having degraded color purity when compared with the Example Compounds.

Comparative Compound C2 showed a narrow full width at half maximum and emitted light having high color purity, but the maximum light-emitting wavelength corresponded to a longer wavelength when compared with the Example Compounds. Comparative Compound C3 emitted light having a longer wavelength when compared with the Example Compounds and showed a wide full width at half maximum value, and as such, light having degraded color purity was emitted.

For example, in comparison to the Comparative Compounds, a plurality of hetero aromatic rings including boron (B) and nitrogen (N) are combined with each other in the polycyclic compounds of the Examples, and therefore a twisting phenomenon (e.g., twisting of the compound structure) may be induced, a high triplet energy level ($T_1$ level) may be maintained, and light having high color purity of deep blue color may be emitted.

(Manufacture of Organic Electroluminescence Device)

On a glass substrate, ITO with a thickness of about 1,500 Å was patterned and washed with ultra-pure water, cleaned with ultrasonic waves, exposed to UV for about 30 minutes and treated with ozone. Then, HAT-CN was deposited to a thickness of about 100 Å, α-NPD was deposited to about 800 Å, and mCP was deposited to a thickness of about 50 Å to form a hole transport region.

Then, the polycyclic compound of an embodiment or the Comparative Compound were co-deposited with mCBP in a ratio of 1:99 to form a layer with a thickness of about 200 Å as an emission layer. For example, the emission layer formed by the co-deposition was formed by mixing Compounds 2, 6, or 8 with mCBP and depositing in Example 1 to Example 3, respectively, or by mixing Comparative Compounds C1, C2, or C3 with mCBP and depositing in Comparative Example 1 to Comparative Example 3, respectively.

After that, a layer with a thickness of about 300 Å was formed on the emission layer using TPBi, and a layer with a thickness of 50 Å was formed using LiQ to form an electron transport region. Then, a second electrode with a thickness of about 1,000 Å was formed using aluminum (Al).

In the Examples, the hole transport region, the emission layer, the electron transport region, and the second electrode were formed using a vacuum deposition apparatus.

(Evaluation of Properties of Organic Electroluminescence Device)

In Table 3, the evaluation results on the organic electroluminescence devices of Example 1 to Example 3, and Comparative Example 1 to Comparative Example 3 are shown. The maximum light-emitting wavelength (λmax), and external quantum efficiency ($EQE_{max}$) of the organic electroluminescence devices were compared and are shown in Table 3. In the evaluation results of the properties on the Examples and the Comparative Examples, as shown in Table 3, the maximum light-emitting wavelength ($\lambda_{max}$) corresponds to the maximum value (e.g., peak intensity) in the emission spectrum, and the external quantum efficiency ($EQE_{max}$) is measured at a luminance of 1,000 cd/m².

TABLE 3

| Device | Dopant material | $\lambda_{max}$ (nm) | $EQE_{max,1000nit}$ (%) |
|---|---|---|---|
| Example 1 | Compound 2 | 467 | 11.2 |
| Example 2 | Compound 6 | 448 | 9.8 |
| Example 3 | Compound 8 | 454 | 10.2 |
| Comparative Example 1 | Comparative Compound C1 | 443 | 3.2 |
| Comparative Example 2 | Comparative Compound C2 | 490 | 4.5 |
| Comparative Example 3 | Comparative Compound C3 | 475 | 4.5 |

Referring to the results in Table 3, it was confirmed that the organic electroluminescence devices according to Example 1 to Example 3 emitted deep blue light of a shorter wavelength and showed higher efficiency properties when compared with the organic electroluminescence devices according to Comparative Example 1 to Comparative Example 3.

In case of the Example Compounds, neighboring aromatic rings are combined and crosslinked by heteroatoms (N, O, S, etc.) adjacent to boron (B), and twisting of the compound was thereby induced to maintain a high $T_1$ level. Without being bound by the correctness of any explanation or theory, it is thought that the Examples showed high external quantum efficiency because reverse intersystem crossing is easily generated due to the effect of the high $T_1$ level.

Comparative Example 1 emitted light having a short wavelength but showed a low external quantum efficiency value, and without being bound by the correctness of any explanation or theory, it is thought that Comparative Compound C1 showed a low $T_1$ level, and TADF emission by reverse intersystem crossing was not expressed. It is considered that Comparative Compound C2 used in Comparative Example 2 emitted light having a relatively long wavelength and had a compound structure with high planarity, and a $T_1$ level was decreased, TADF emission was not expressed, and a relatively low external quantum efficiency value was shown. In Comparative Example 3, it is considered that aromatic polycycles were not combined with each other via heteroatom (N, O, S, etc.) linkers, twist in the compound was not induced in Comparative Compound C3, and both the Si level and $T_1$ level were lowered (e.g., simultaneously lowered), such that light having a long wavelength was shown and a low external quantum efficiency value was shown.

In the polycyclic compound of an embodiment, neighboring aromatic rings are combined and crosslinked with each other via a heteroatom (N, O, S, etc.) adjacent to boron (B) of the aromatic ring, such that twist of the compound may be induced, a high $T_1$ level may be maintained, blue light having a short wavelength may be emitted, and high efficiency properties may be shown. In addition, the organic electroluminescence device of an embodiment includes the polycyclic compound of an embodiment in an emission layer, so as to have a narrow full width at half maximum in a light-emitting wavelength region and to show excellent color properties and high emission efficiency properties.

The organic electroluminescence device of an embodiment may show improved device characteristics with a high efficiency in a blue wavelength region.

The polycyclic compound of an embodiment is included in an emission layer of an organic electroluminescence device and may contribute to increasing the efficiency of the organic electroluminescence device.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although example embodiments of the present disclosure have been described, it is understood that the present disclosure should not be limited to these example embodiments, and that various changes and modifications can be made by one ordinary skilled in the art within the spirit and scope of the present disclosure as hereinafter claimed, and equivalents thereof.

What is claimed is:

1. An organic electroluminescence device, comprising:
a first electrode;
a second electrode on the first electrode; and
an emission layer between the first electrode and the second electrode, and comprising a polycyclic compound represented by Formula 1,
wherein the first electrode and the second electrode each independently comprise silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), indium (In), tin (Sn), zinc (Zn), any compound thereof, any mixture thereof, or any oxide compound thereof;

[Formula 1]

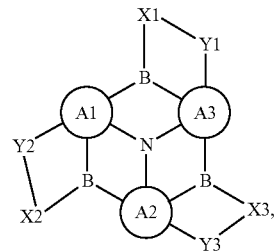

wherein in Formula 1,

A1, A2, and A3 are each independently a substituted or unsubstituted hydrocarbon ring of 5 to 30 carbon atoms to form a ring, or a substituted or unsubstituted heterocycle of 2 to 30 carbon atoms to form a ring, X1, X2, and X3 are each independently a substituted or unsubstituted hydrocarbon ring of 5 to 30 carbon atoms to form a ring, or a substituted or unsubstituted heterocycle of 2 to 30 carbon atoms to form a ring, Y1, Y2, and Y3 are each independently *—NRa—*, *—O—*, or *—S—*, and Ra is a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, or a substituted or unsubstituted heteroaryl group of 2 to 30 carbon atoms to form a ring, and wherein each pair of A1 and X1, A2 and X2, and A3 and X3 is neither directly bonded to each other nor bonded to each other by substituents.

2. The organic electroluminescence device of claim 1, wherein:

A1, A2, and A3 are each independently an unsubstituted benzene ring, or a benzene ring substituted with at least one substituent, and the at least one substituent is a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group.

3. The organic electroluminescence device of claim 1, wherein X1, X2, and X3 are each independently an unsubstituted benzene ring or a substituted benzene ring with at least one substituent selected from a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, and a substituted or unsubstituted amine group.

4. The organic electroluminescence device of claim 1, wherein the compound represented by Formula 1 is represented by Formula 2:

[Formula 2]

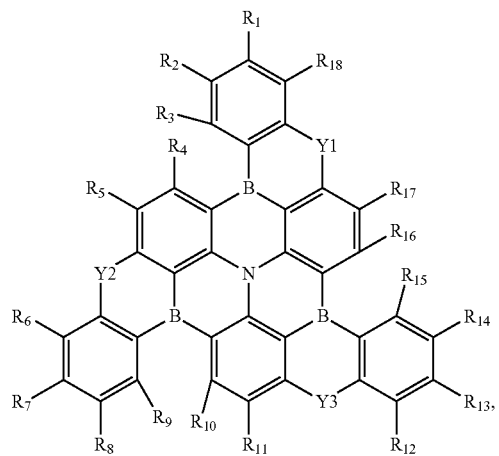

wherein in Formula 2,
R$_1$ to R$_{18}$ are each independently a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group, and Y1, Y2, and Y3 are the same as defined in Formula 1, and wherein each pair of R$_3$ and R$_4$, R$_9$ and R$_{10}$, and R$_{15}$ and R$_{16}$ is neither directly bonded to each other nor bonded to each other by substituents.

5. The organic electroluminescence device of claim 1, wherein Y1, Y2, and Y3 are the same.

6. The organic electroluminescence device of claim 1, wherein at least one selected from Y1, Y2, and Y3 is *—NRa—*, and the remainder is *—O—* or *—S—*.

7. The organic electroluminescence device of claim 1, wherein the emission layer is to emit delayed fluorescence.

8. The organic electroluminescence device of claim 1, wherein:
the emission layer comprises a host and a dopant, and
the dopant comprises the polycyclic compound.

9. The organic electroluminescence device of claim 1, wherein the emission layer is to emit light with a central wavelength of about 430 nm to about 470 nm.

10. The organic electroluminescence device of claim 1, wherein the emission layer comprises at least one selected from polycyclic compounds in Compound Group 1:

[Compound Group 1]

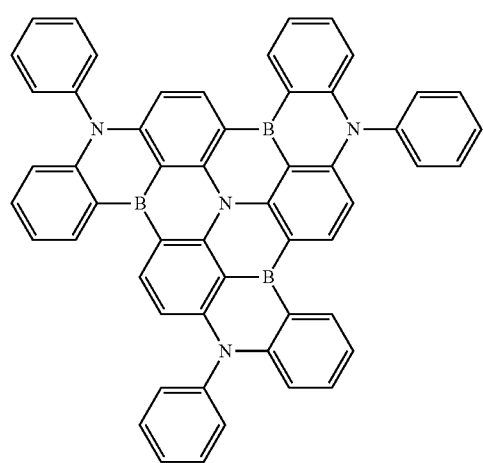
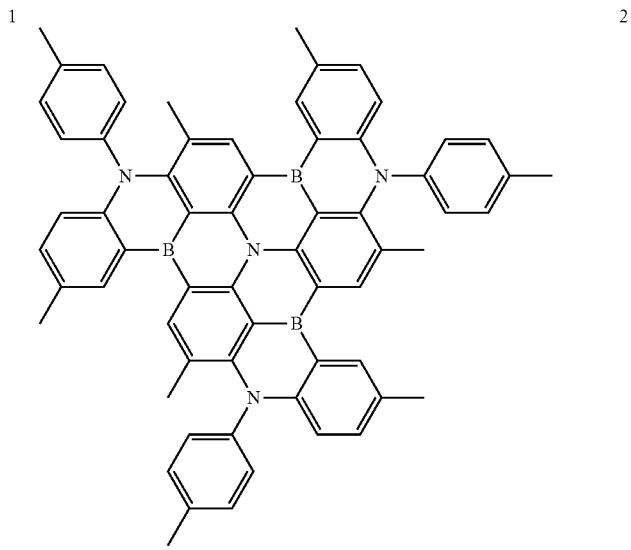

-continued
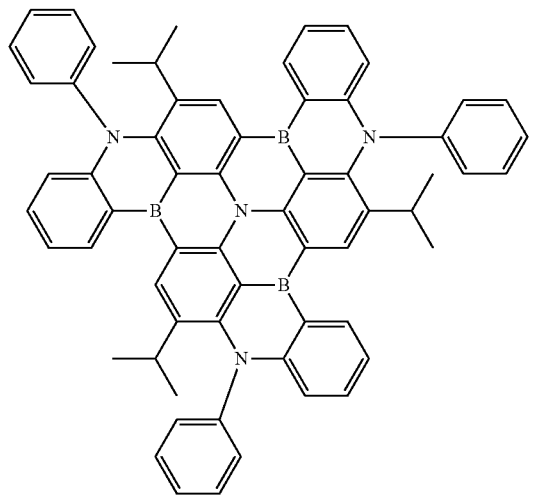
3
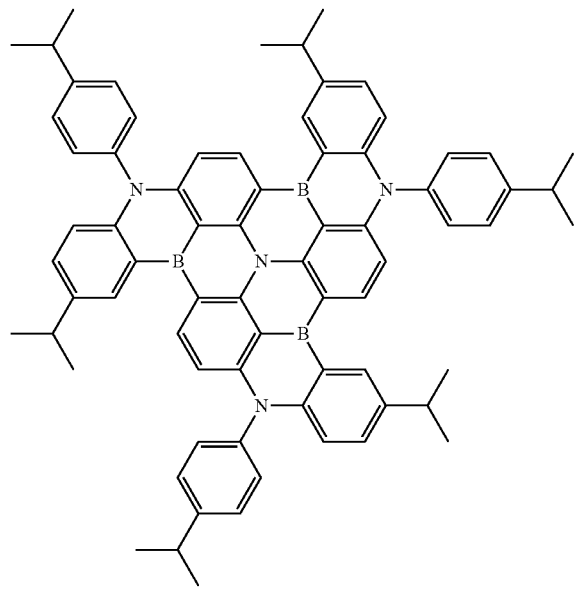
4
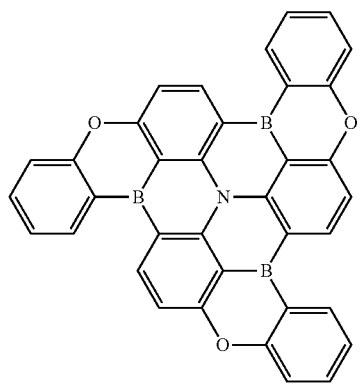
5
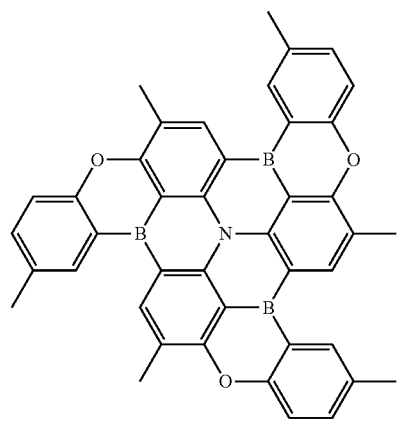
6
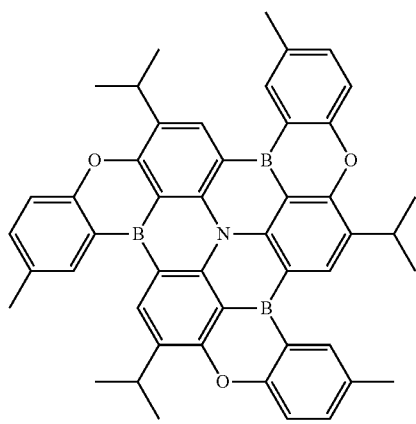
7
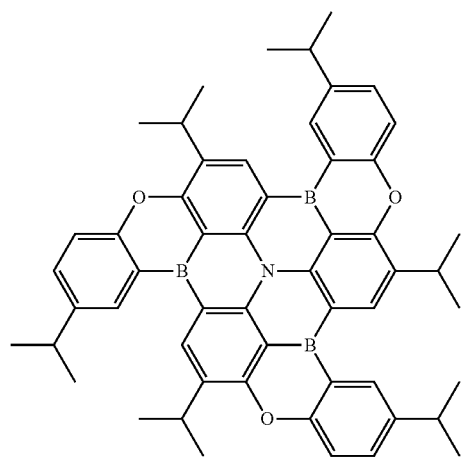
8

9
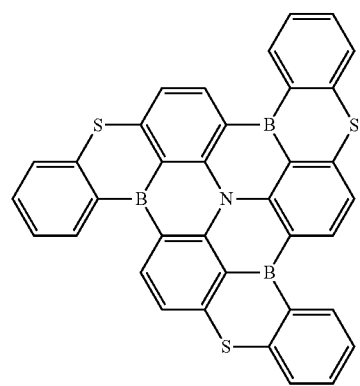
10
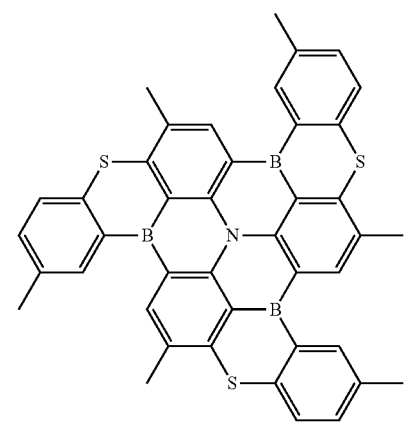
11
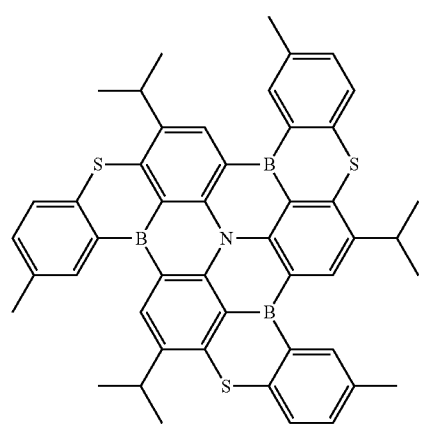
12
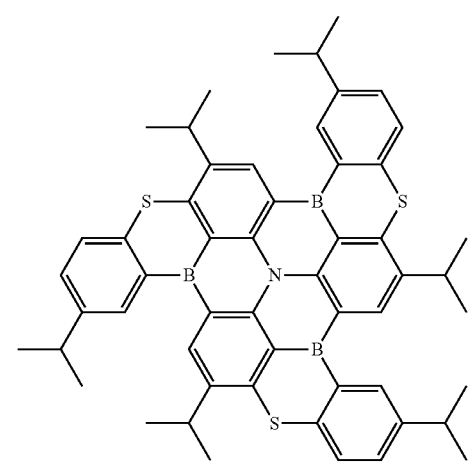
13
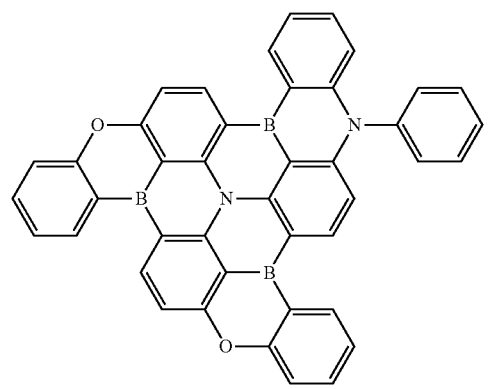
14
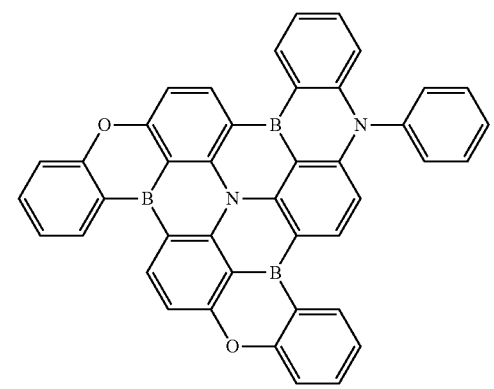

-continued
15
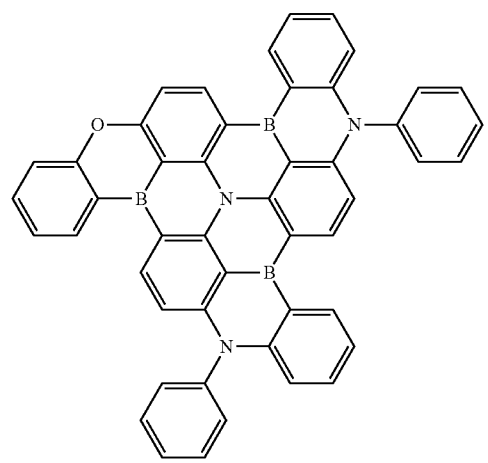
16
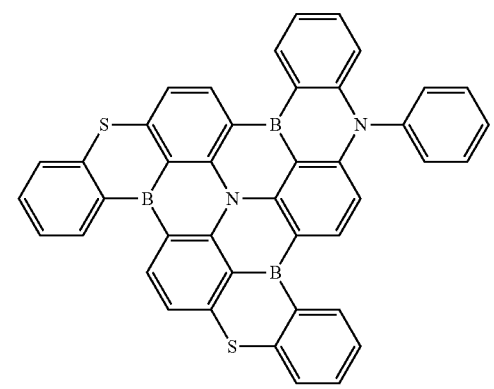
17
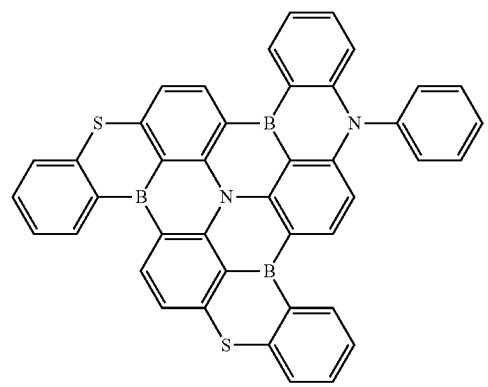
18
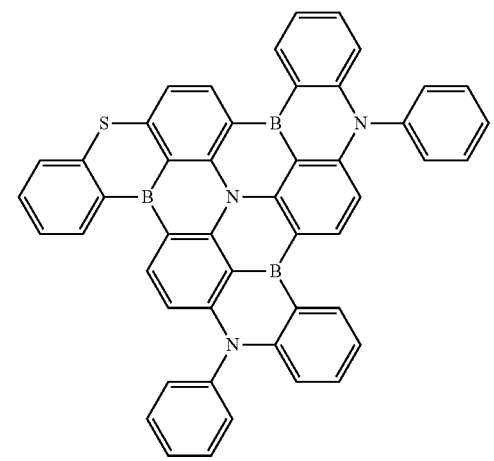
19
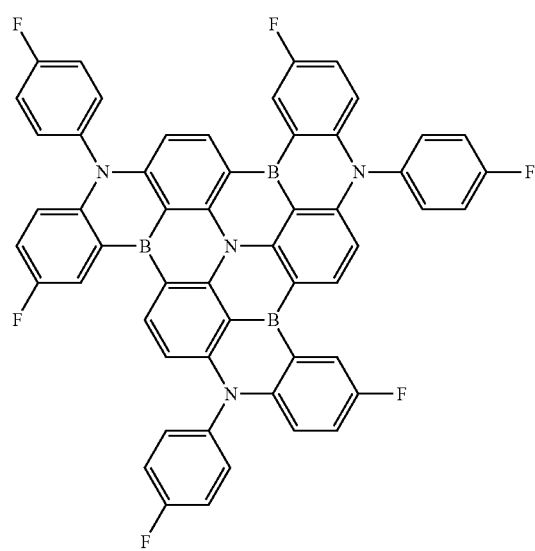
20
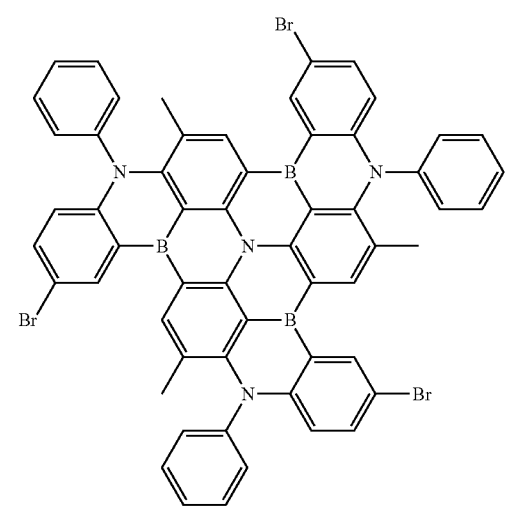

21
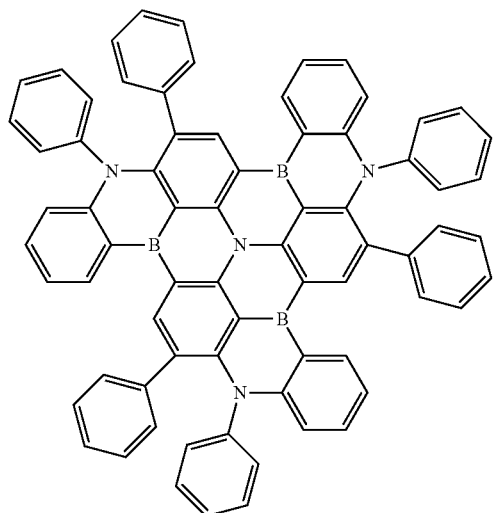
22
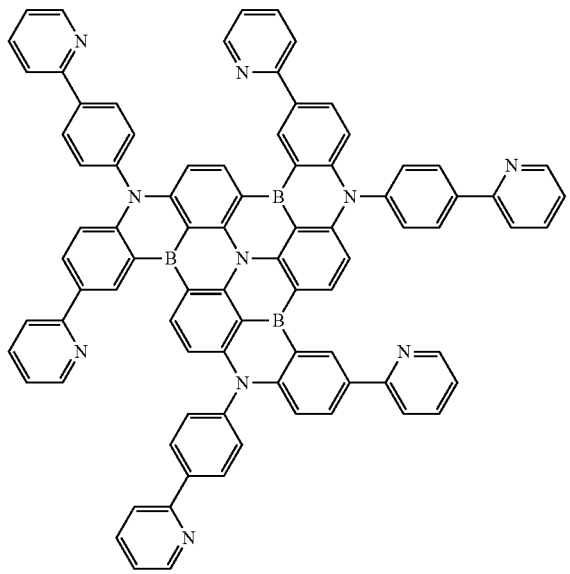
23
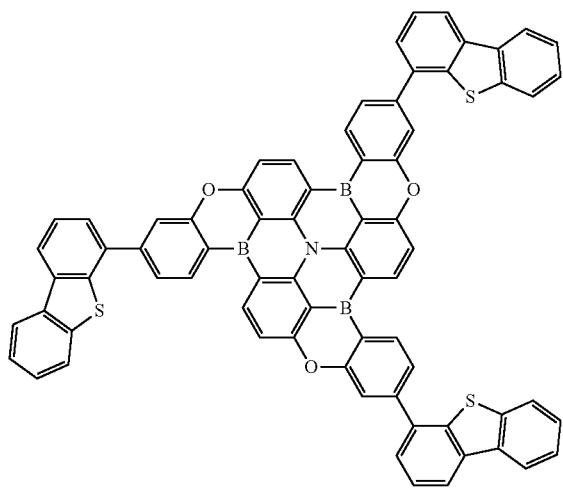
24
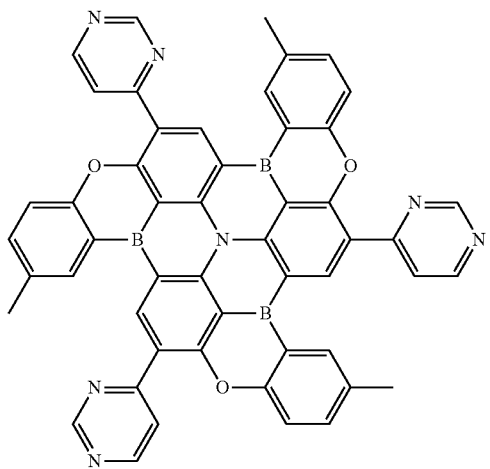

25
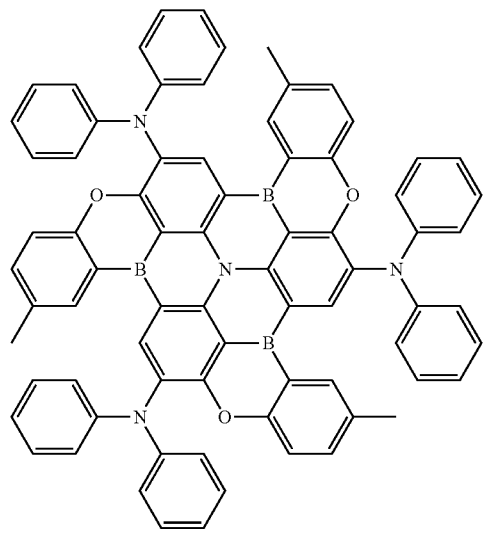
26
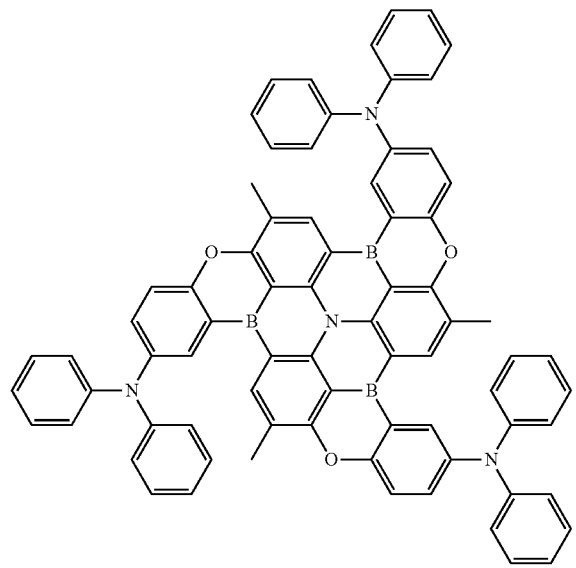
27
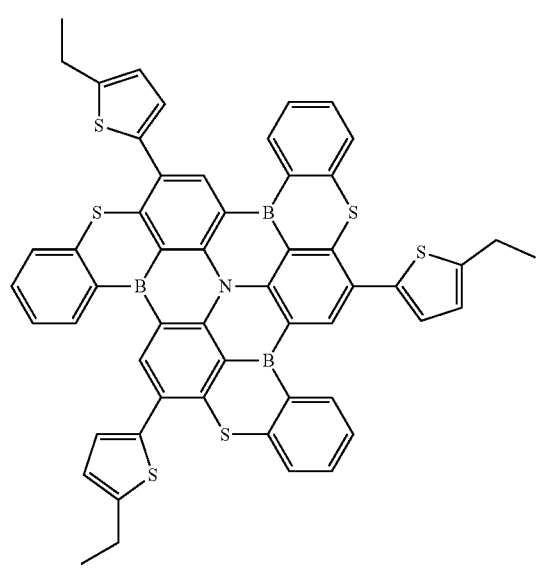
28
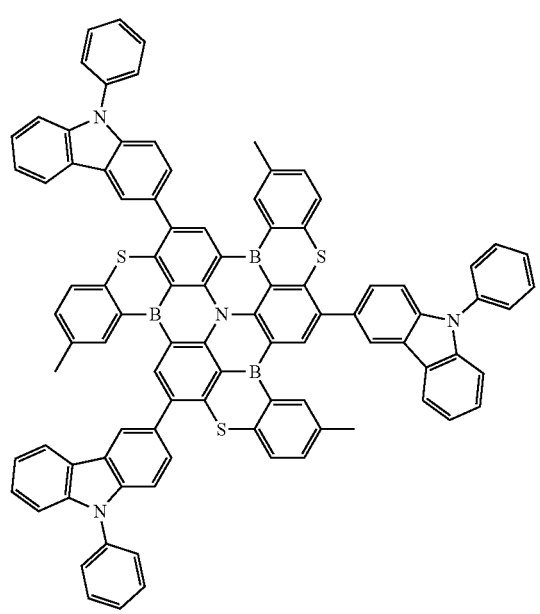

29
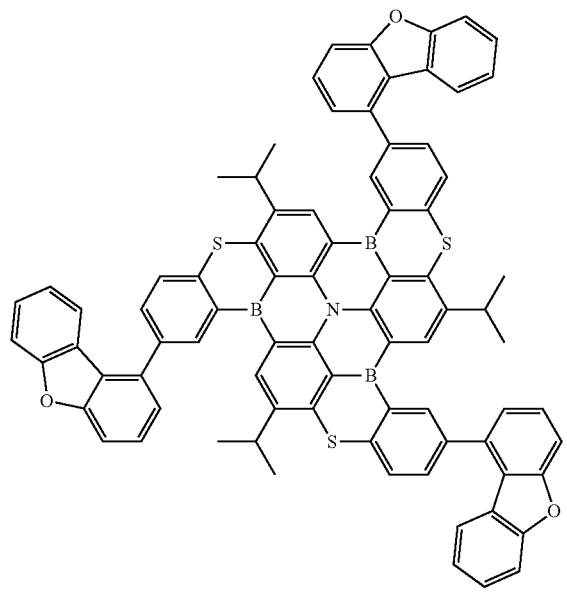
30
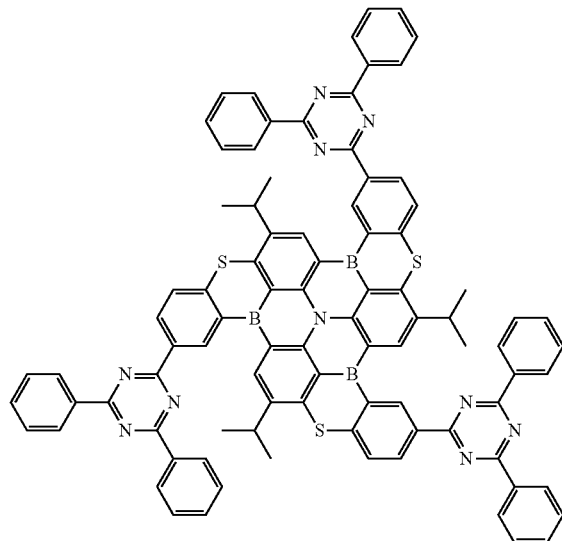
31
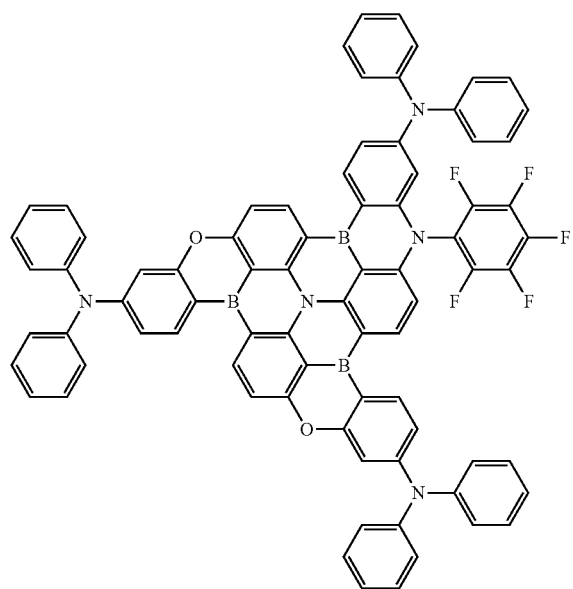
32
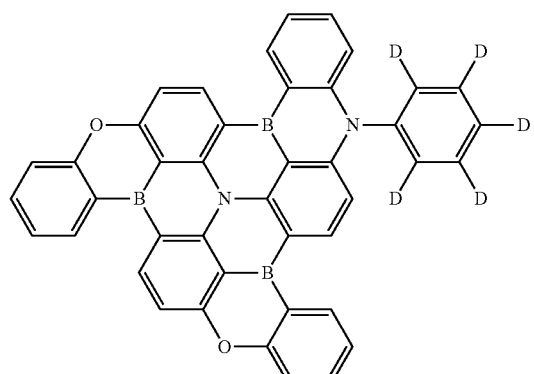

-continued
33
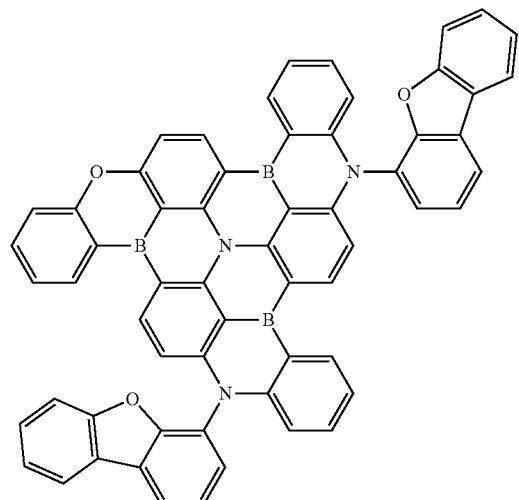
34
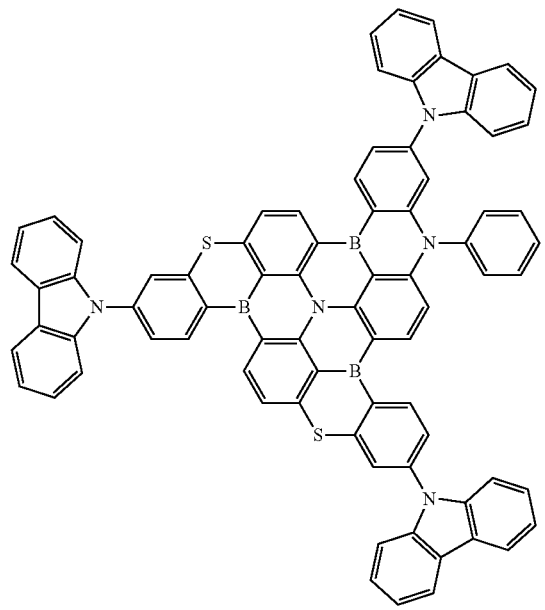
35
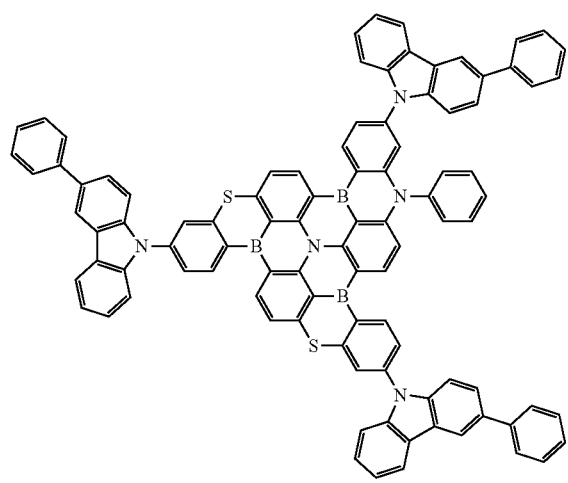
36
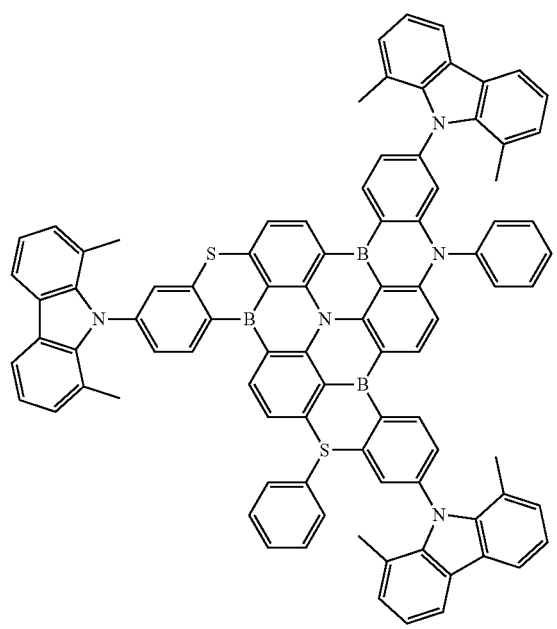

37
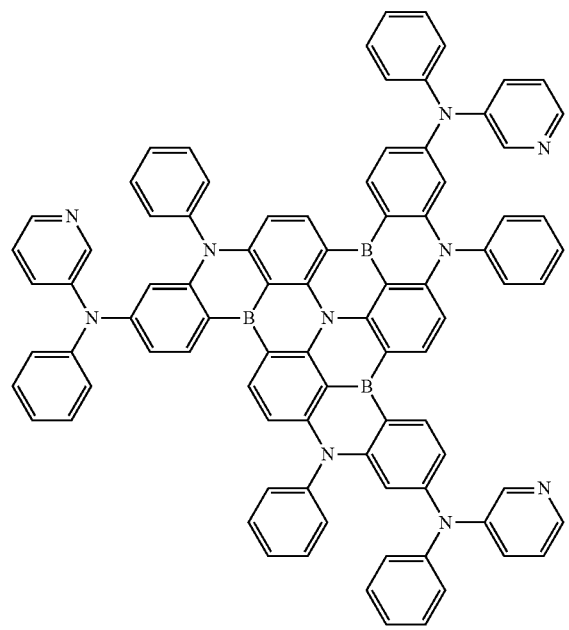
38
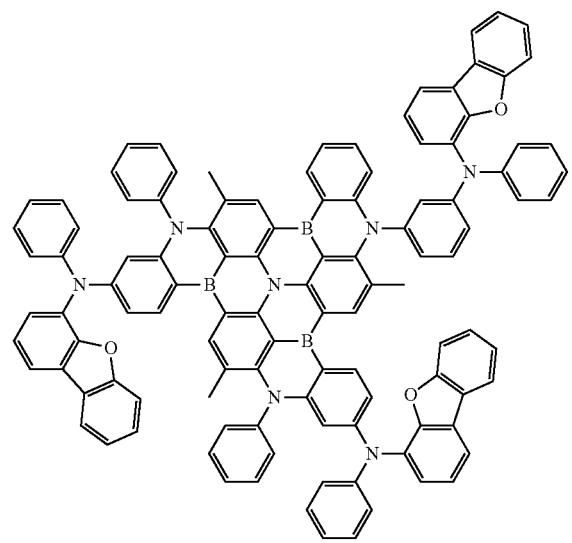
39
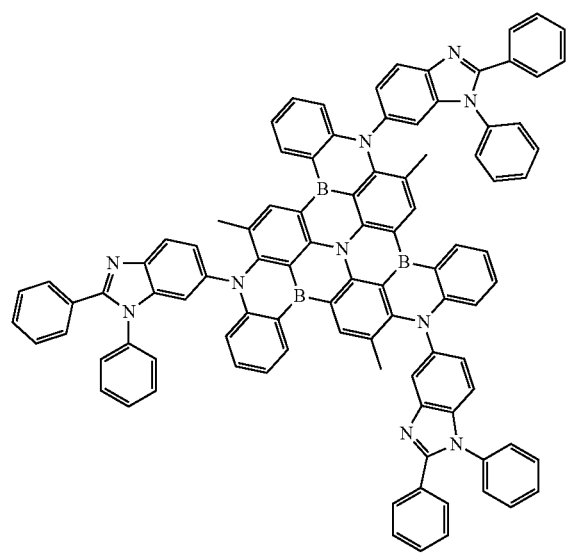
40
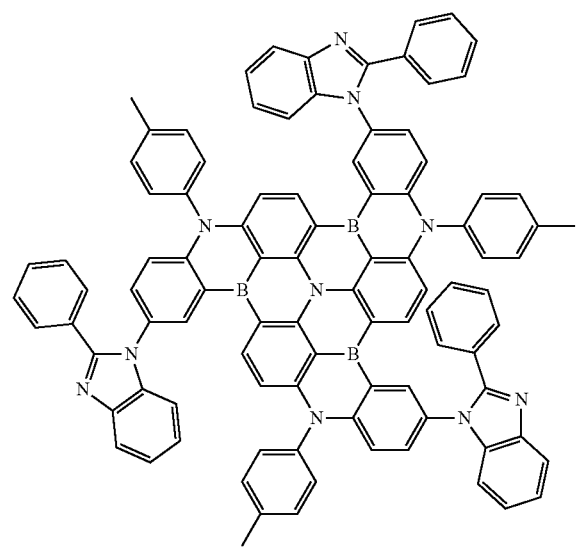

-continued
41
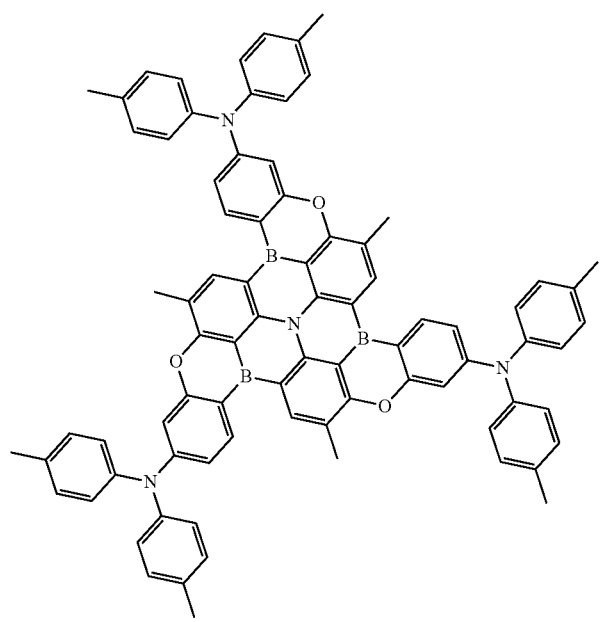
42
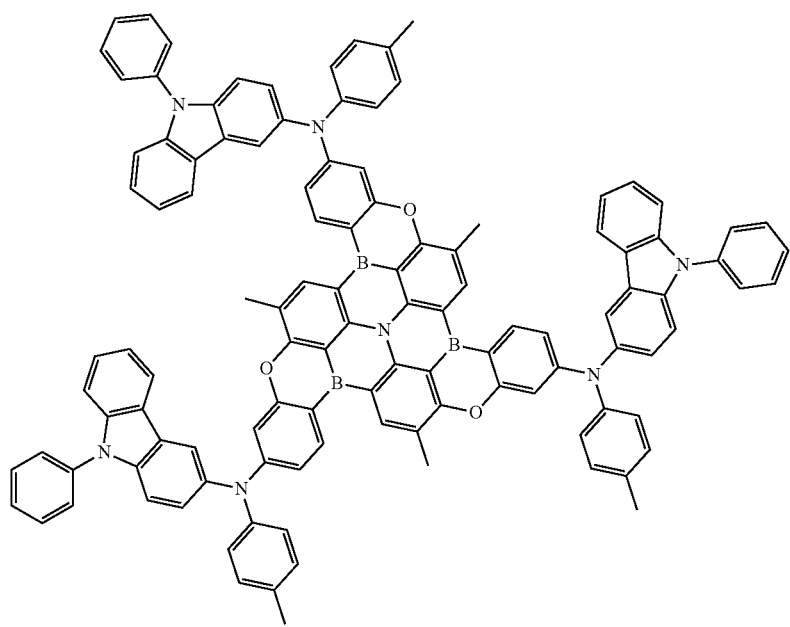

-continued

43
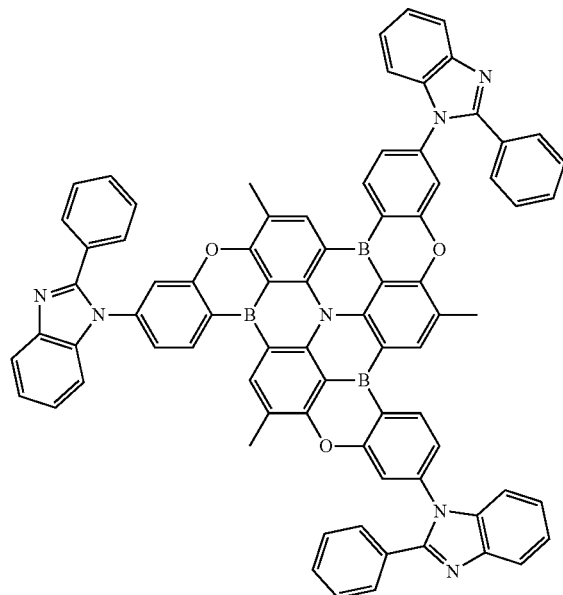

44
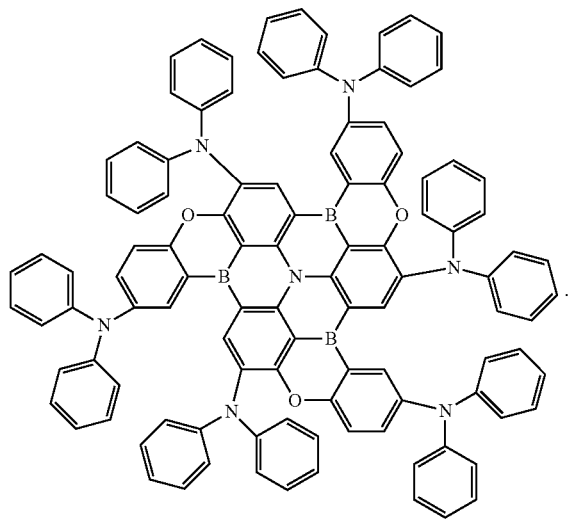

11. A polycyclic compound represented by Formula 1:

[Formula 1]

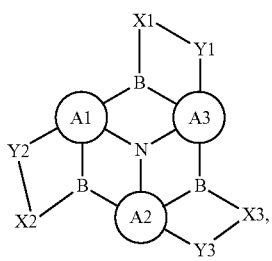

wherein in Formula 1,

A1, A2, and A3 are each independently a substituted or unsubstituted hydrocarbon ring of 5 to 30 carbon atoms to form a ring, or a substituted or unsubstituted heterocycle of 2 to 30 carbon atoms to form a ring, X1, X2, and X3 are each independently a substituted or unsubstituted hydrocarbon ring of 5 to 30 carbon atoms to form a ring, or a substituted or unsubstituted heterocycle of 2 to 30 carbon atoms to form a ring, Y1, Y2, and Y3 are each independently *—NRa—*, *—O—*, or *—S—*, and Ra is a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, or a substituted or unsubstituted heteroaryl group of 2 to 30 carbon atoms to form a ring, and wherein each pair of A1 and X1, A2 and X2, and A3 and X3 is neither directly bonded to each other nor bonded to each other by substituents.

12. The polycyclic compound of claim 11, wherein:

A1, A2, and A3 are each independently an unsubstituted benzene ring, or a benzene ring substituted with at least one substituent, and the at least one substituent is a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group.

13. The polycyclic compound of claim 11, wherein X1, X2, and X3 are each independently an unsubstituted benzene ring, or a benzene ring substituted with at least one substituent, and the at least one substituent is a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group.

14. The polycyclic compound of claim 11, wherein the compound represented by Formula 1 is represented by Formula 2:

[Formula 2]

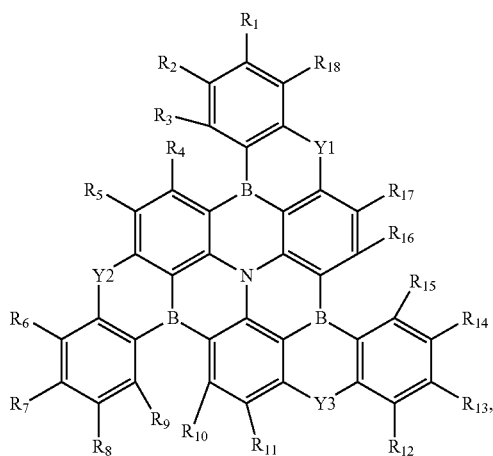

wherein in Formula 2, $R_1$ to $R_{18}$ are each independently a hydrogen atom, a deuterium atom, a halogen atom, a substituted or unsubstituted alkyl group of 1 to 20 carbon atoms, a substituted or unsubstituted aryl group of 6 to 30 carbon atoms to form a ring, a substituted or unsubstituted heteroaryl group of 2 to 30 carbon atoms to form a ring, or a substituted or unsubstituted amine group, and Y1, Y2, and Y3 are the same as defined in Formula 1, wherein each pair of $R_3$ and $R_4$, $R_9$ and $R_{10}$, and $R_{15}$ and $R_{16}$ is neither directly bonded to each other nor bonded to each other by substituents.

15. The polycyclic compound of claim 11, wherein Y1, Y2, and Y3 are the same.

16. The polycyclic compound of claim 11, wherein at least one selected from Y1, Y2, and Y3 is *—NRa—*, and the remainder is *—O—*, or *—S—*.

17. The polycyclic compound of claim 11, wherein the polycyclic compound represented by Formula 1 is a blue dopant to emit blue light having a central wavelength of about 470 nm or less.

18. The polycyclic compound of claim 11, wherein the lowest triplet excitation energy level ($T_1$ level) of the polycyclic compound represented by Formula 1 is greater than about 2.6 eV.

19. The polycyclic compound of claim 11, wherein the polycyclic compound represented by Formula 1 is a material to emit thermally activated delayed fluorescence.

20. The polycyclic compound of claim 11, wherein Formula 1 is selected from compounds represented in Compound Group 1:

[Compound Group 1]

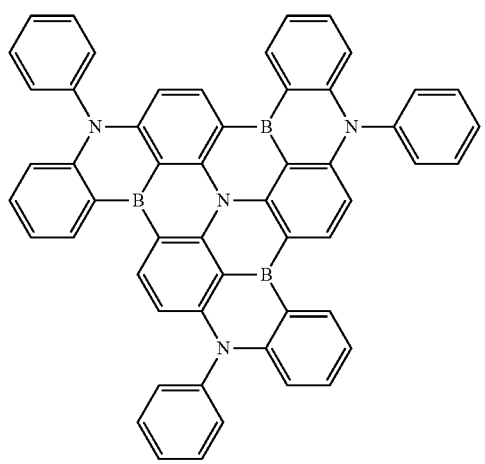

1

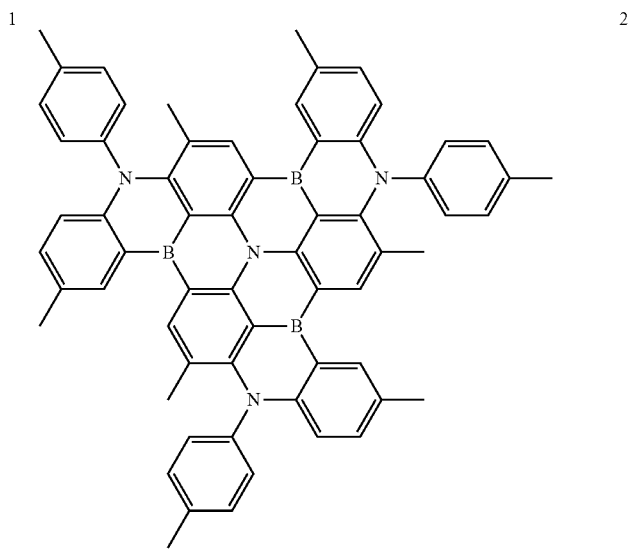

2

-continued
81
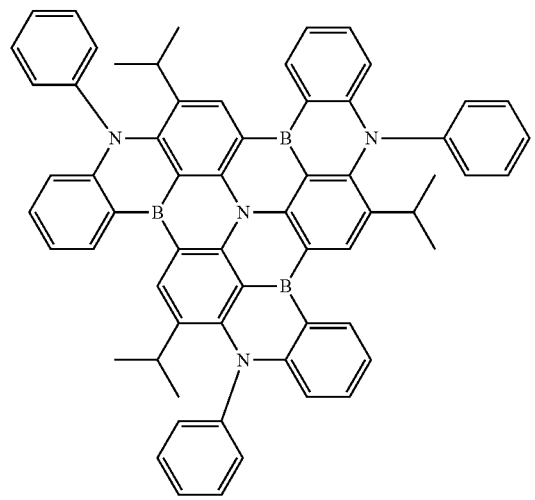
3
82
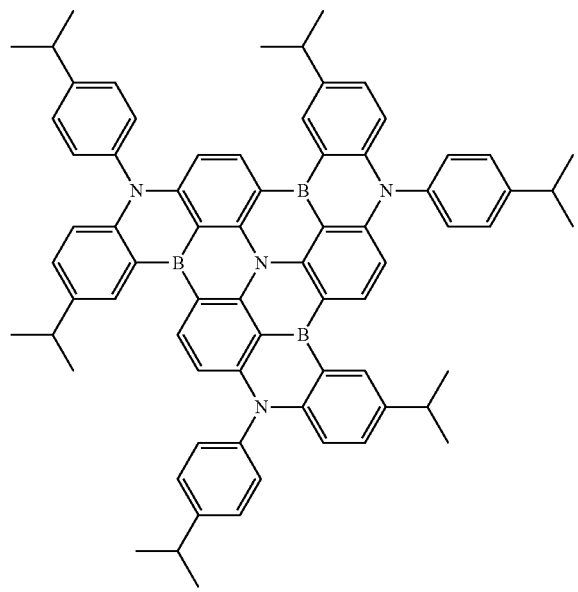
4
5
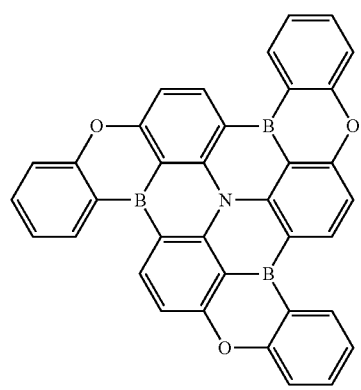
6
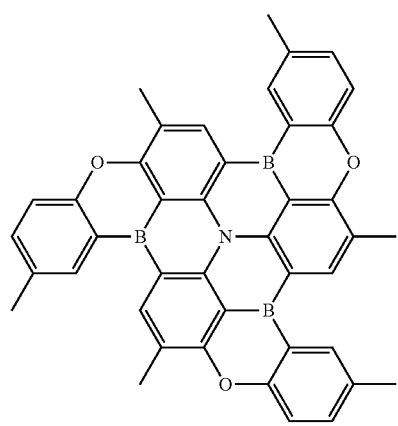
7
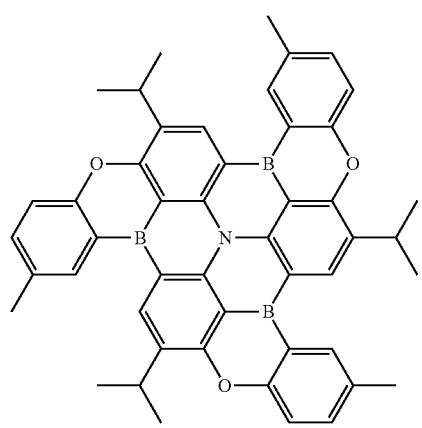
8
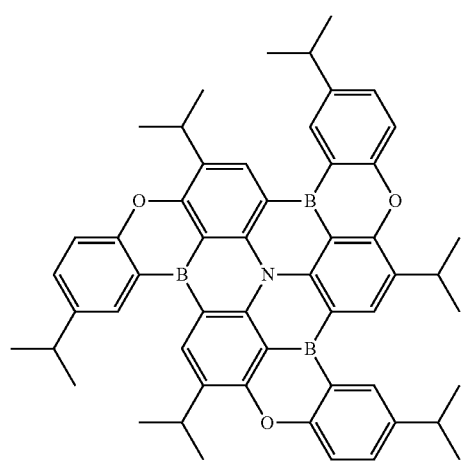

-continued
9
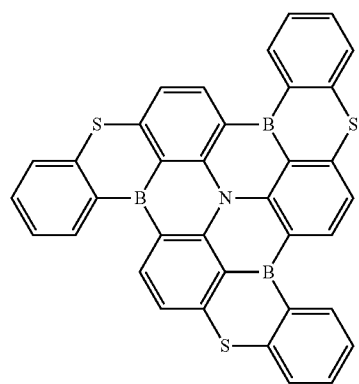
10
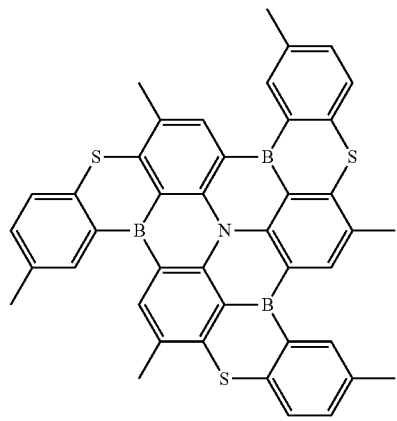
11
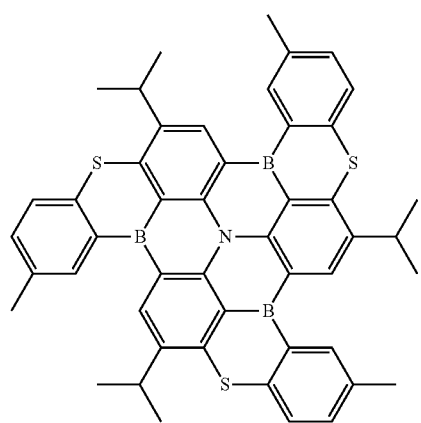
12
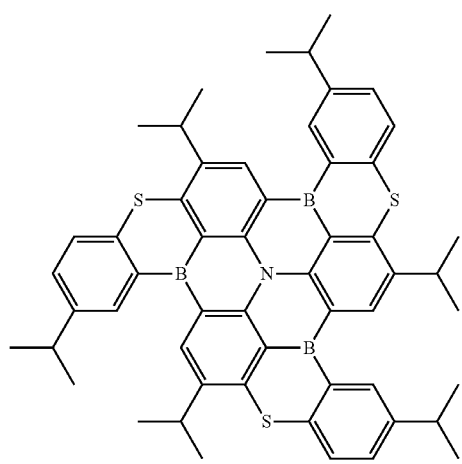
13
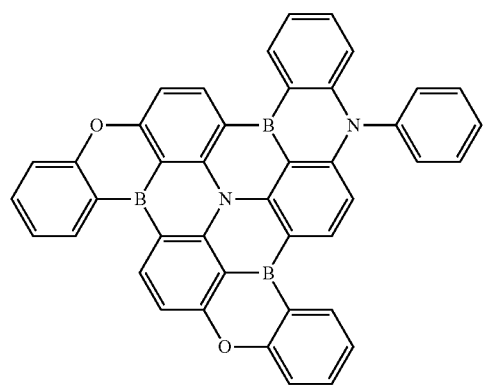
14
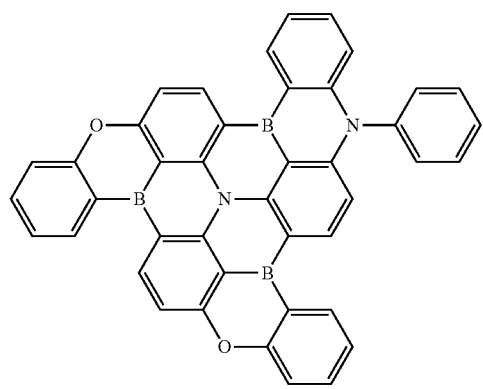

-continued
| 15 | 16 |
|---|---|
| 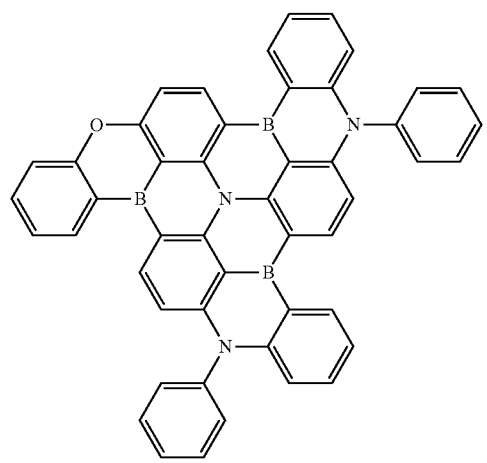 | 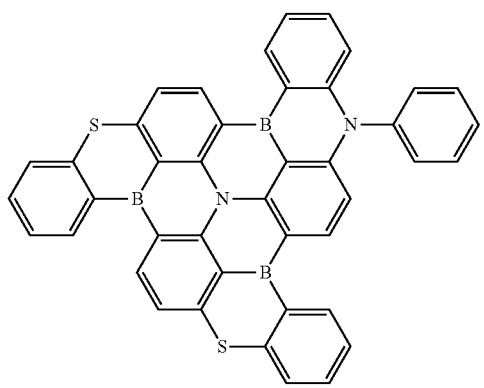 |
| 17 | 18 |
| 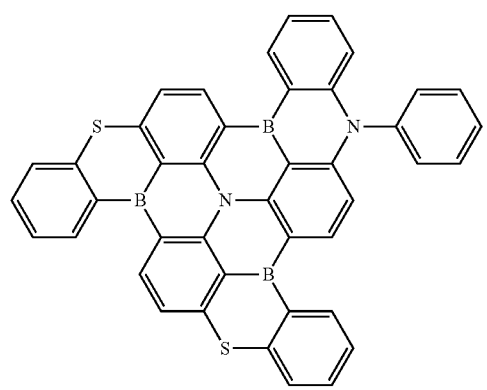 | 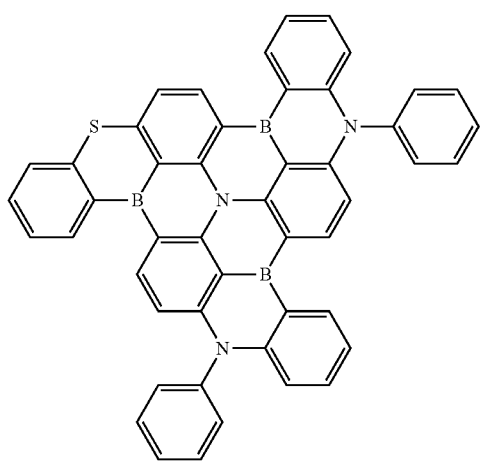 |
| 19 | 20 |
| 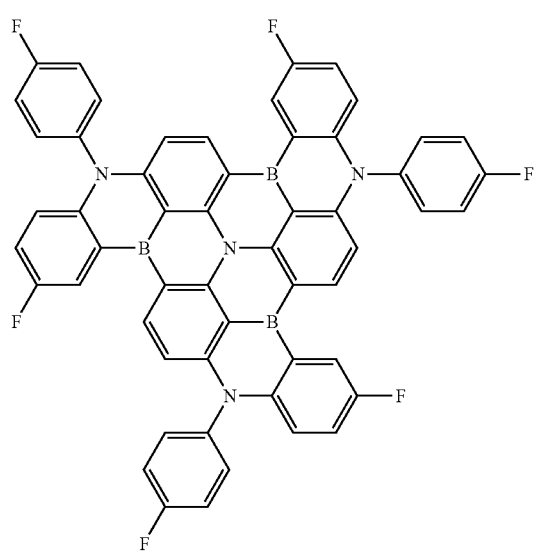 | 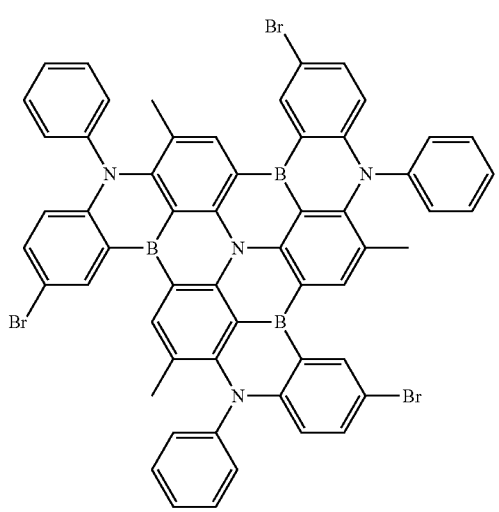 |

21
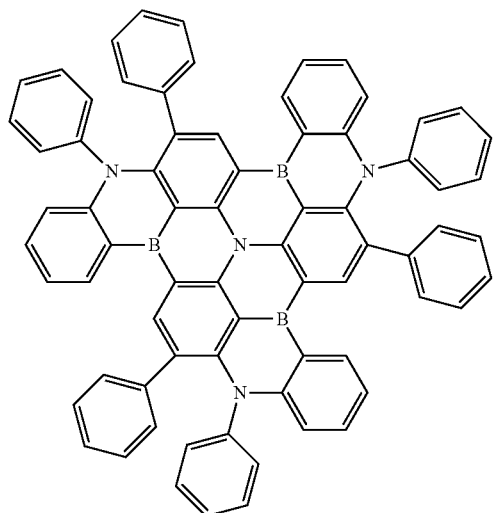
22
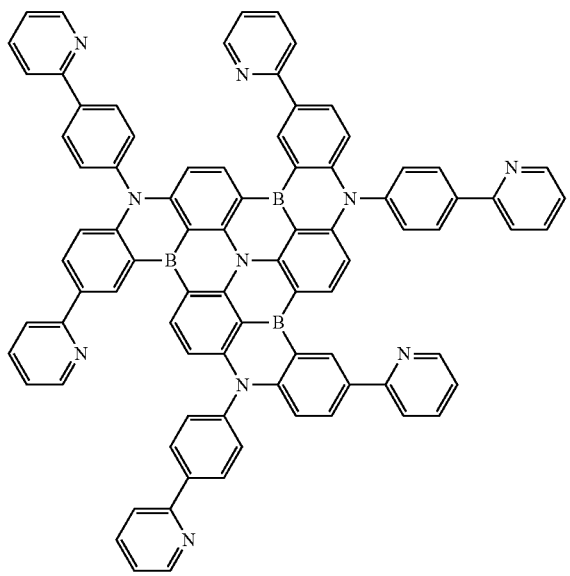
23
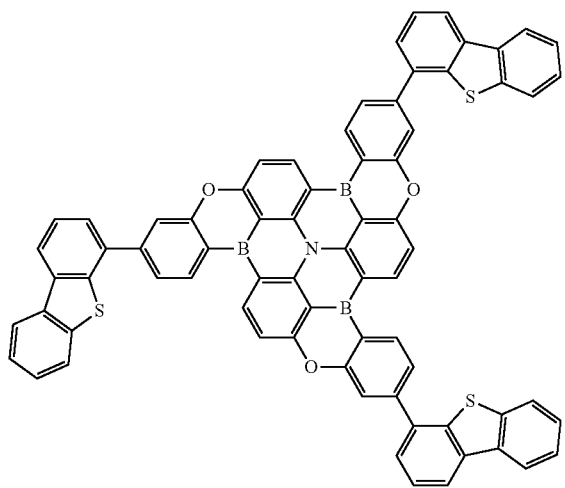
24
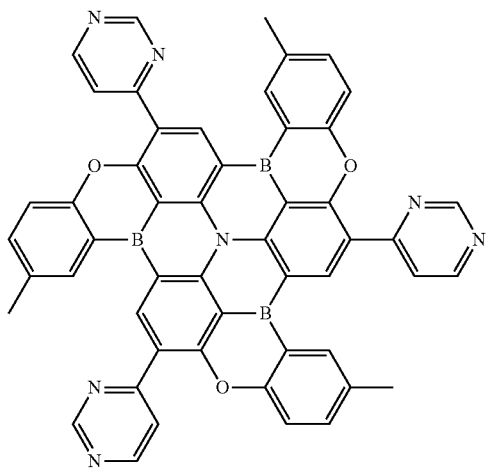

-continued
25
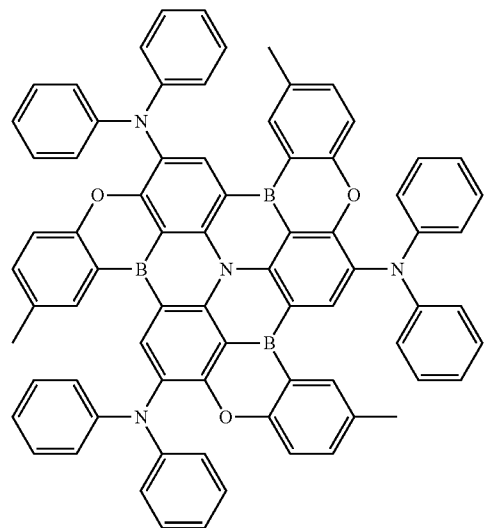
26
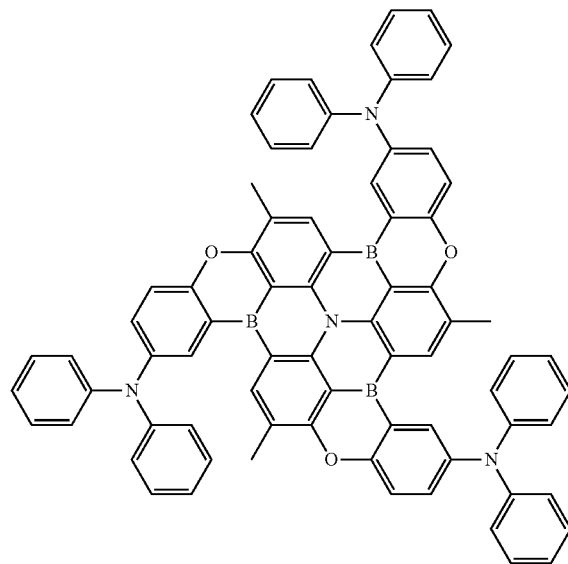
27
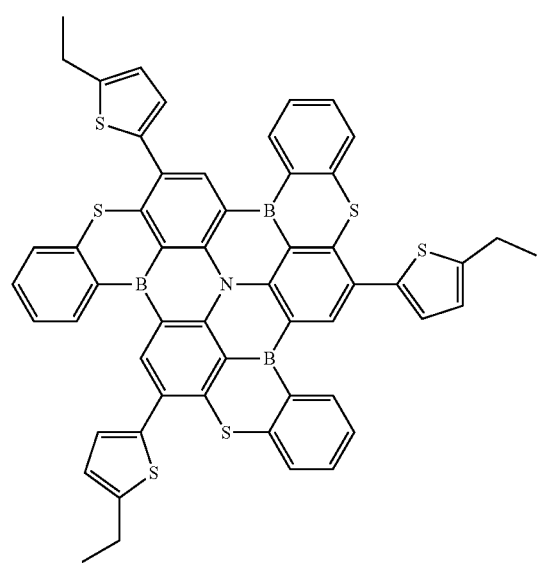
28
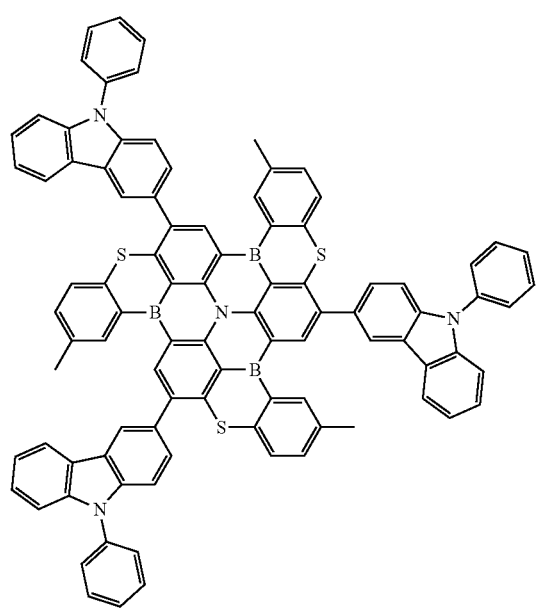

29
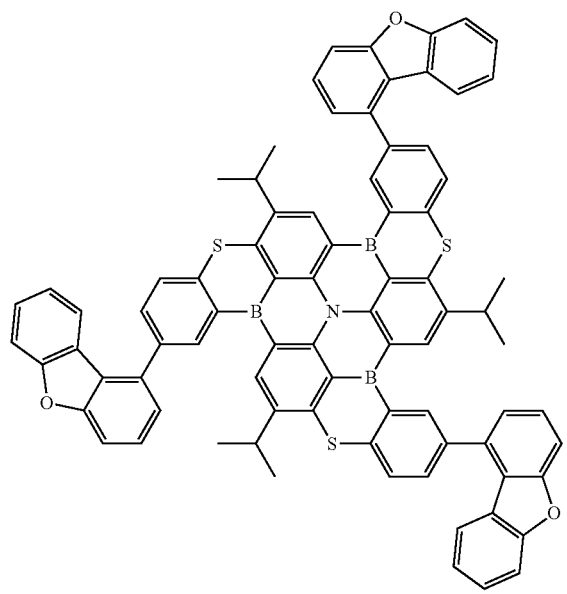
30
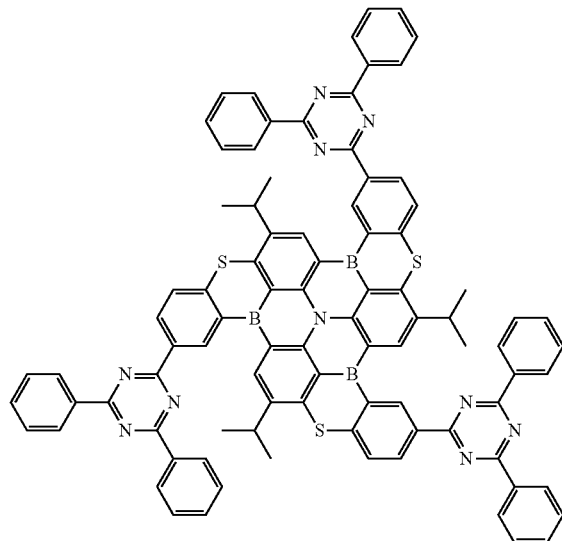
31
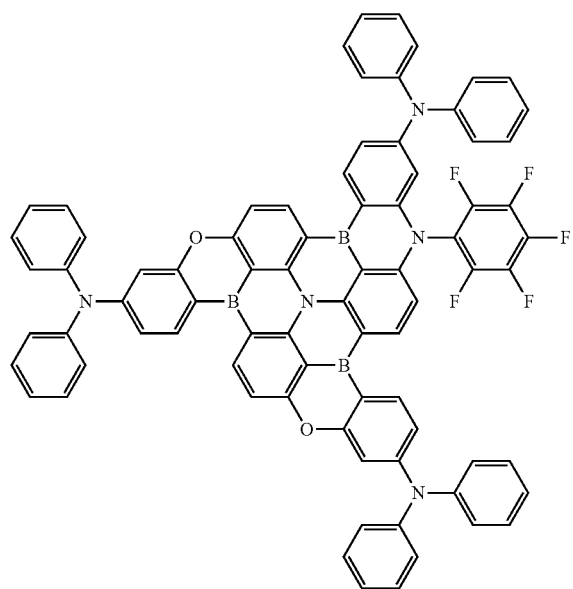
32
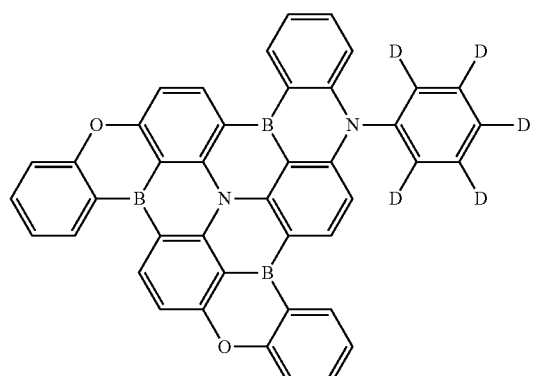

-continued
33
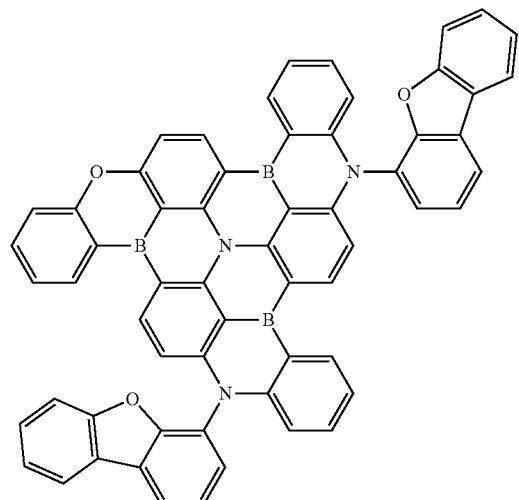
34
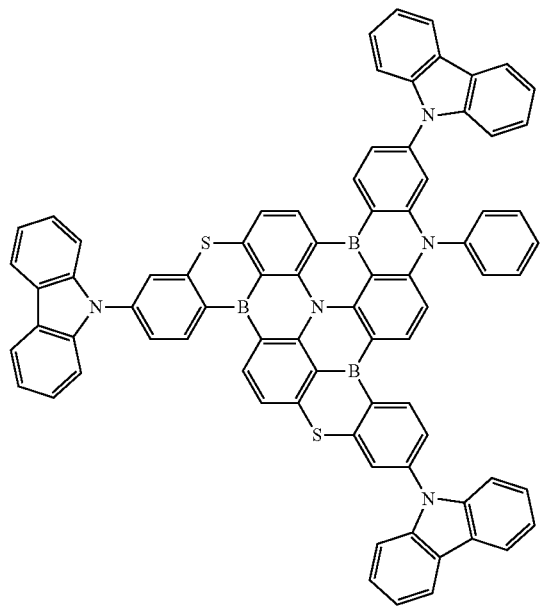
35
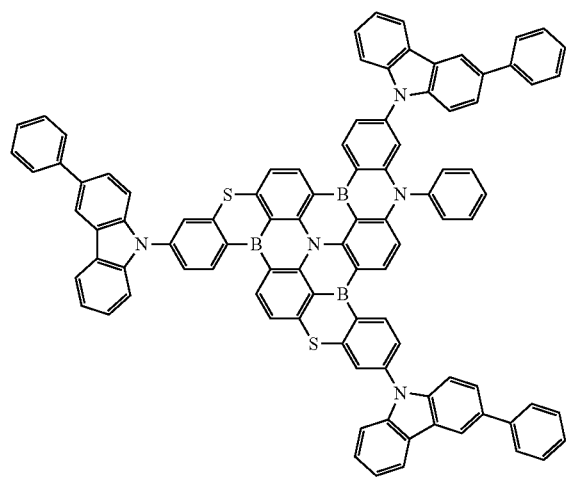
36
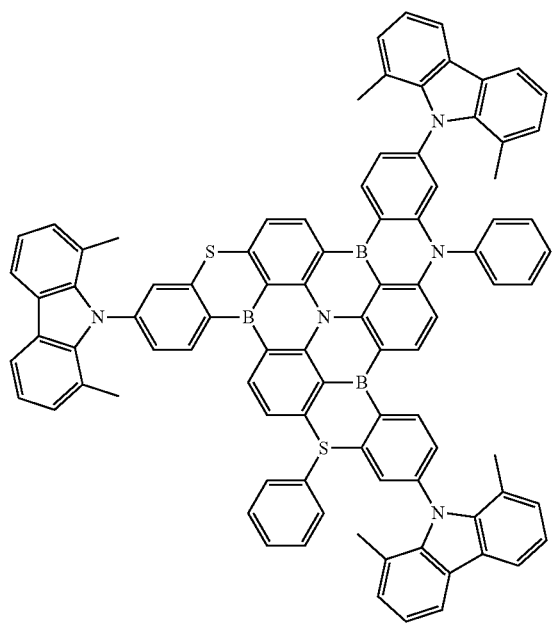

37
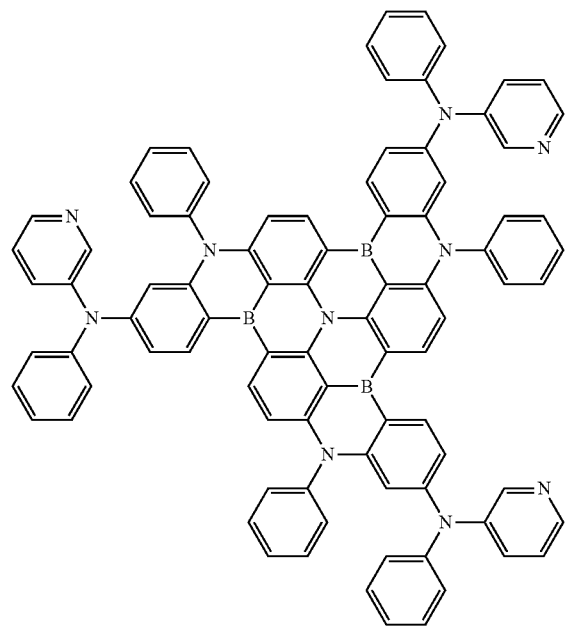
38
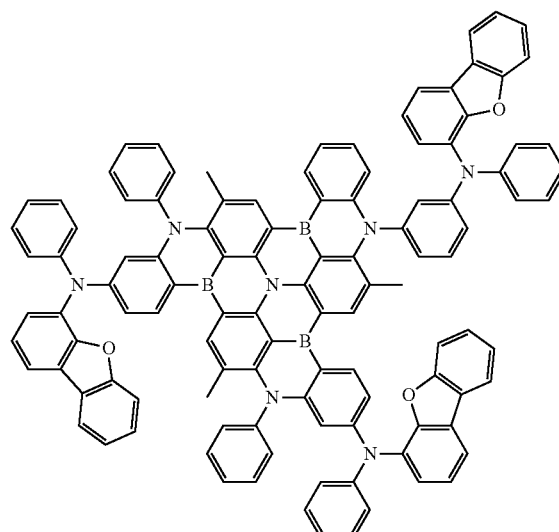
39
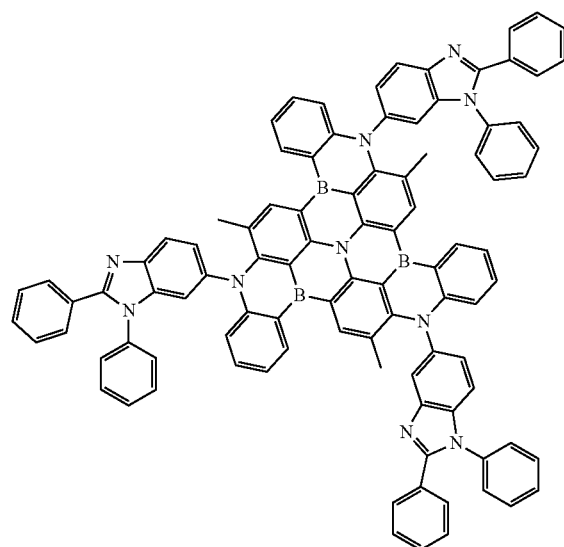
40
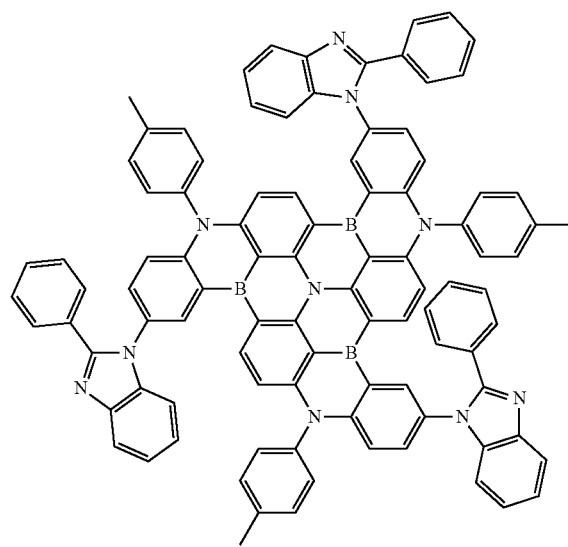

-continued
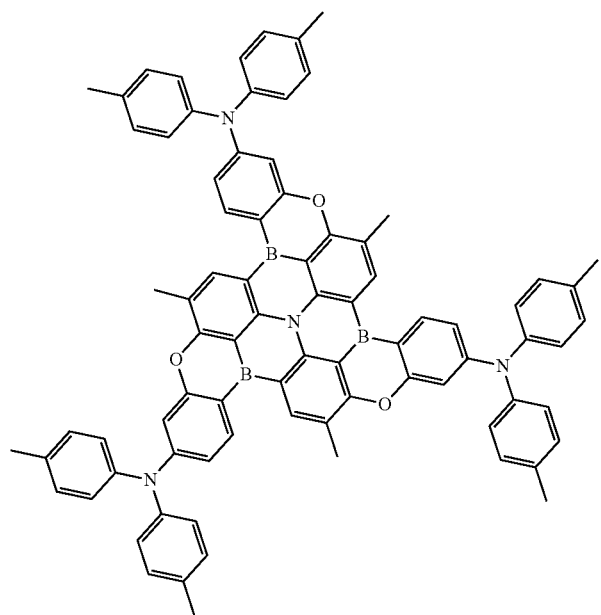
41
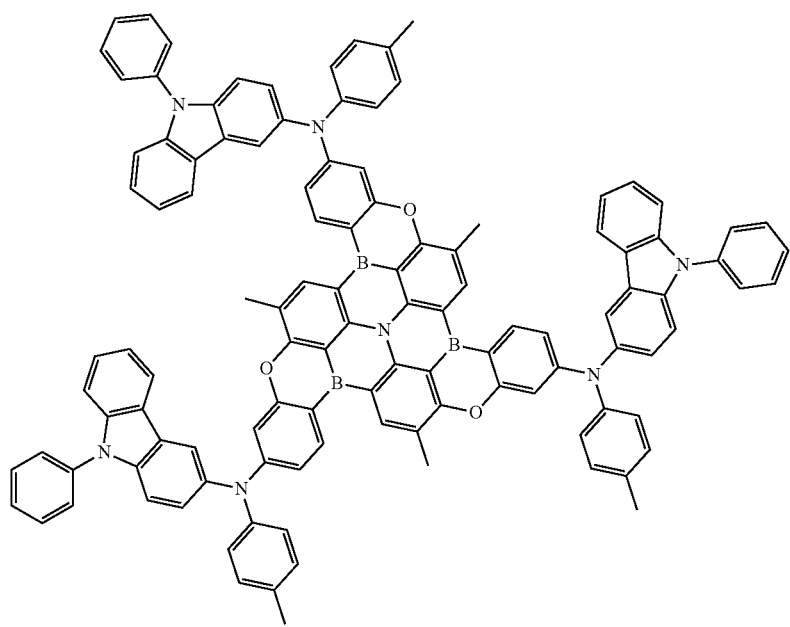
42

-continued
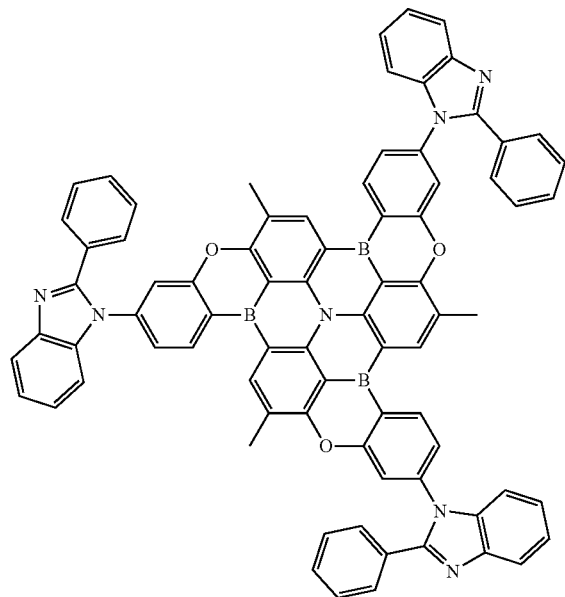
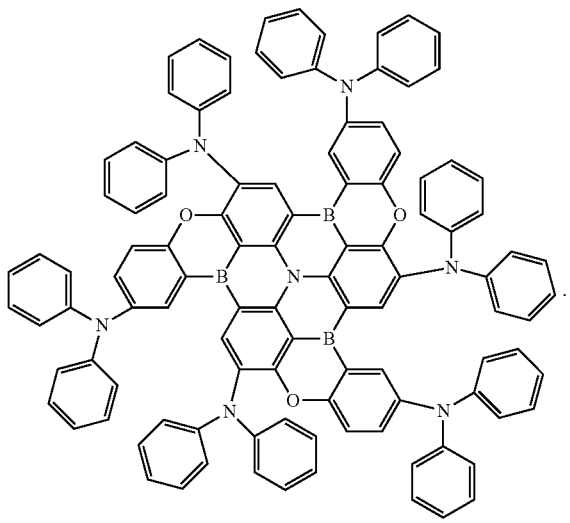
* * * * *